US006711060B2

(12) United States Patent
Sakakibara

(10) Patent No.: US 6,711,060 B2
(45) Date of Patent: Mar. 23, 2004

(54) NON-VOLATILE SEMICONDUCTOR MEMORY AND METHODS OF DRIVING, OPERATING, AND MANUFACTURING THIS MEMORY

(75) Inventor: Kiyohiko Sakakibara, Tokyo (JP)

(73) Assignee: Renesas Technology Corp., Tokyo (JP)

(*) Notice: Subject to any disclaimer, the term of this patent is extended or adjusted under 35 U.S.C. 154(b) by 128 days.

(21) Appl. No.: 10/095,527

(22) Filed: Mar. 13, 2002

(65) Prior Publication Data

US 2002/0097607 A1 Jul. 25, 2002

Related U.S. Application Data

(62) Division of application No. 09/505,671, filed on Feb. 17, 2000, now Pat. No. 6,445,617.

(30) Foreign Application Priority Data

Feb. 19, 1999 (JP) .......................................... 11-042224

(51) Int. Cl.[7] ............................................... G11C 16/04

(52) U.S. Cl. ............................ 365/185.18; 365/185.22; 365/185.29

(58) Field of Search ....................... 365/185.18, 185.22, 365/185.24, 185.05, 185.27, 185.29

(56) References Cited

U.S. PATENT DOCUMENTS

| | | | | |
|---|---|---|---|---|
| 5,032,881 A | | 7/1991 | Sardo et al. | |
| 5,452,248 A | * | 9/1995 | Naruke et al. | 365/185.18 |
| 5,546,340 A | | 8/1996 | Hu et al. | |
| 5,574,686 A | * | 11/1996 | Watsuji et al. | 365/185.24 |
| 5,583,364 A | | 12/1996 | Nakamura | |
| 5,925,912 A | | 7/1999 | Arai et al. | |
| 6,046,472 A | | 4/2000 | Ahmad et al. | |

FOREIGN PATENT DOCUMENTS

| | | |
|---|---|---|
| JP | 3-230566 | 10/1991 |
| JP | 4-211178 | 8/1992 |
| JP | 9-260517 | 10/1997 |
| JP | 10-144809 | 5/1998 |
| JP | 10-178113 | 6/1998 |
| JP | 11-233653 | 8/1999 |

OTHER PUBLICATIONS

Yamada et al., "A Self–Convergence Erase for NOR Flash EEPROM Using Avalanche Hot Carrier Injection", IEEE Trans, Electron. Device, vol. 43, 1996, p. 1937.

Nissan–Cohen, "A Novel Floating–Gate Method for Measurement of Ultra–Low Hoe and Electron Gate Currents in MOS Transistors", IEEE Electron Device Letters, EDL–7, 1986, p. 561.

* cited by examiner

*Primary Examiner*—Son T. Dinh
(74) *Attorney, Agent, or Firm*—Burns, Doane, Swecker & Mathis, L.L.P.

(57) ABSTRACT

In a transistor including first and second diffused layers of a second conductance, opposite to each other through a channel region of a first conductance type, and a two-storied gate electrode on the channel region of the first conductance type, a channel region and one of the diffused layers are set at a first voltage level; the other thereof is set at a second voltage level; a control gate is set at the first or a third voltage level; a difference between the first and second voltage levels is set larger in absolute value than that between the first and third voltage levels; and a part of charges flowing in the channel region with respect to the transistor flowing a channel current is injected into the floating gate. This solves difficulties of large driving currents at write back, a long write back time, deterioration of channel conductance, and the like.

6 Claims, 22 Drawing Sheets

| OPERATION | DRAIN | GATE | SOURCE | BACK GATE |
|---|---|---|---|---|
| READ | 1V | 0-5V | 0V | 0V |
| WRITE | 6V | -8V | OPEN | 0V |
| ERASE | OPEN | 9V | -8V | -8V |
| WRITE BACK | 0V | 0V | 6V | 0V |

| OPERATION | DRAIN | GATE | SOURCE | BACK GATE |
|---|---|---|---|---|
| READ | 1V | 0-5V | 0V | 0V |
| WRITE | 6V | -8V | OPEN | 0V |
| ERASE | OPEN | 9V | -8V | -8V |
| WRITE BACK | 7V | 8V | 0V | 0V |

NON-VOLATILE SEMICONDUCTOR MEMORY AND METHODS OF DRIVING, OPERATING, AND MANUFACTURING THIS MEMORY

This application is a divisional of Application Ser. No. 09/505,671, filed on Feb. 17, 2000 now U.S. Pat. No. 6,445,617.

BACKGROUND OF THE INVENTION

1. Field of the Invention

The present invention relates to a non-volatile semiconductor memory having a two-storied gate of a floating gate and a control gate, and methods of driving, operating, manufacturing this memory.

2. Description of the Prior Art

FIG. 26 is a diagram showing a memory cell array configuration in a non-volatile semiconductor memory such as a conventional flash memory, and illustrates a NOR flash memory. In FIG. 26, WLm−1 to WLm+1 designate word lines; BLn−1 to BLn+1 designate bit lines; and SL designates a source line.

First, an over-erased condition in the flash memory will be described.

In an array architecture called NOR or DINOR-type in memory cells, there is a difficulty that when there exists a cell in which a threshold voltage Vth (hereinafter, just referred to as Vth) is in a depletion state, i.e. Vth<0 on the same bit line, Vth measurements of the all cells on that bit line cannot be carried out. For example, when the Vth of a cell corresponding to BLn/WLm surrounded by circle A in FIG. 26 is in a depletion state, even if the threshold voltages Vths of the other cells on the BLn line are in an enhanced condition (Vth>0), the Vths of the other cells cannot be measured since all the Vths become 0 V or less due to an effect of the cell of BLn/WLm.

Hence, when a Vth distribution in the aforementioned array configuration is checked, cells in proportion to the number of cells on the same bit line are determined to have a value of Vth<0 in a Vth distribution of over-erase failure as shown in FIG. 27. The cells in a depletion condition may cause upon the extraction of electrons from the floating gate of a flash memory when some electrons are accidentally over-extracted.

This phenomenon is described as an erratic over erase in "A Self-Convergence Erase for NOR Flash EEPROM Using Avalanche Hot Carrier Injection" (Document 1: IEEE Trans. Electron Devices, vol.43, p.1937, 1996, S. Yamada et al.).

A write back of the threshold voltage Vth of an over-erased cell will be next described. The write back herein referred to is writing back the Vth of the erased cell to an enhancement condition. Various methods of performing the write back are disclosed in the prior art.

First, a method by channel hot electron (CHE) injection is known as an electron injection to cells in flash memories. Here, the CHE write is a method that high energy electrons accelerated over a barrier height of an oxide are injected into a floating gate among channel electrons accelerated by a steep electric field around the drain of memory cells.

Second, an over-erased bit write back by CHE will be described with a cell structure of conventional NOR flash memories. FIG. 28 is a schematic cross-section of a flash memory cell for explanation of a conventional over-erased bit write back by CHE. In FIG. 28, the reference numeral 11 designates a p-type semiconductor substrate; 12*a*, 12*b* designate n channel source and drain regions, respectively; 13 is a first gate oxide; 14 designates a floating gate made of polycrystalline silicon or polysilicon and the like; 15 designates a three-layered insulating film of oxide, nitride, and oxide, called 'ONO' for leakage countermeasure; 16 designates a control gate made of polycrystalline silicon and the like; and Vs, Vd, Vcg, and Vsug designate a source voltage, a drain voltage, a control voltage, and a substrate voltage, respectively. Note that the control voltage Vcg is typically set at a higher value than the drain voltage Vd.

A flash memory employing a CHE method is provided with deeply-doped P+ substrate concentration ($\sim 10^{18}$ $cm^{-3}$) and N+ diffused layer ($\sim 10^{20}$ $cm^{-3}$) in the vicinity of the drain for enhancement of CHE efficiency. For example, FIG. 29 is a graph showing an impurity distribution on the channel surface around the drain edge in a conventional cell structure. This shows a change from decrease to increase after a surface position P0 in which a value of logN plunges. In the conventional cell structure, the CHE efficiency is earned by controlling the expansion of a depletion layer within a p channel substrate region. Referring to the previous Document 1, a drain injection is written $As=5\times10^{15} cm^{-2}$. The N+ diffused layer concentration after thermal treatment or annealing becomes $10^{20}$ $cm^{-3}$ or more in such an injection condition.

Next, the operation will be described.

The cell write is performed in such a manner that high energy electrons or CHE accelerated over the barrier height of the first gate oxide 13 are injected into the floating gate 14 among channel electrons accelerated by a steep electric field around the drain. On the other hand, the cell write back may be performed in such a manner that the threshold voltages Vths of over-erased cells are brought to an enhancement condition by the above CHE method.

However, the following difficulties exist in this method.

(1) Since the over-erased cells have to be selected, the circuit configuration becomes complicated.

(2) Since a Vth variation width to be written is different from that of a conventional write, a desired voltage has to be set for drain/gate. That is, this voltage requires another potential disposition which differs from that typically used to bring cells to a write condition.

(3) A channel current has to be driven upon write back operations. (Id~several tens $\mu$A/cell)

On the other hand, a write back method using a gate current due to Drain Avalanche Hot Electron (hereinafter abbreviated to DAHE) and Drain Avalanche Hot Hole (hereinafter abbreviated to DAHH) is disclosed as a method without performing bit selections in the write back by the above CHE method (see Document 1).

Hereinafter, a cell structure employing such a write back method will be described.

FIG. 30 is a schematic cross-section of a flash memory cell for explanation of a conventional write back of over-erased bits by DAHE/DAHH. In FIG. 30, the device configuration is substantially the same as the above memory cell by CHE and the description will be omitted. However, there is a difference in a voltage application to electrodes: GND level is applied to Vcg, while GND level or a negative bias is applied to Vsub.

As shown in FIG. 31, the gate current Ig in a cell in flash memories having that drain structure is known in that gate currents specified by DAHH, DAHE, and CHE in turn from a lower side of gate voltages are observed in a gate voltage region in which a channel current flows. This phenomenon is also described in the Document 1 or others (for example, Document 2: IEEE Electron Devices Letter, EDL-7, p.561

(1986), Y. Nissan-Cohen, and Document 3: U.S. Pat. No. 5,546,340, Chung-Yu Hu et al.) Here, the gate current of DAHE/DAHH is that among pairs of electrons and holes generated in a high electric field region near the drain together with "seed" currents flowing in a channel, the electrons or holes accelerated at a high-energy level in said field are injected into a floating gate. The use of that DAHH/DAHE enables to write back over-erased cells self-convergently.

Hereinafter, evaluations in accordance with this write back method will be described.

A cell structure is employed, which has a sectional configuration in FIG. 32 referring to the aforementioned Document 1. FIG. 34 is a graph showing results that evaluated in a unit cell the write back by this method.

When a cell over-erased up to about 0 V was left on a condition of drain voltage Vd=5 V and control gate voltage Vcg=0 V, the convergence Vth was written back to about 1.75 V after about 0.1 sec. Thus, the write back method does not require a bit selection which raises an issue in the CHE method, and may be left in such a manner that a drain voltage is applied to all bit lines in an array with a gate voltage of 0 V.

Further, a feature of this method is that even a condition having a Vth higher than the convergence Vth tends to vary toward this convergence Vth. That is, as shown in a graph of gate current characteristics on use of self-convergence in FIG. 31, a cell less than the convergence Vth causes DAHE injection (electron injection) and a floating potential decreases to a value Vg* in the graph. As a result, the cell Vth is written back up to the convergence Vth. On the other-hand, a cell more than the convergence Vth causes DAHH injection (hole injection) and the floating potential increases to the value Vg*. As a result, the cell Vth decreases to the convergence Vth. Thus, there is a balance between the DAHE electron injection and the DAHH hole injection in the convergence Vth, that is, both the electron and hole injections continue.

FIG. 35 is a graph showing dependency of drain voltage Vd in the write back method by self-convergence. It is apparent that a time required for the write back increases as drain voltage lowers from Vd=6 V to Vd=4 V.

FIG. 36 is a graph showing gate voltage Vg—drain current Id characteristics in a cell reaching a convergence point, i.e. a convergence Vth in the write back method by self-convergence. It is apparent that a current still flows in a written-back cell even in Vg=0 V in FIG. 36. This measurement was performed at Vd=1 V, and a several-μA/bit current could flow upon an actual write back (upon application of Vd=~5 V). In addition, referring to FIG. 39, it is apparent that a drain current Id of 20 μA (=$2\times10^{-5}$ A) could flow stably in the range of $10^1$ to $10^2$ sec for a write back operation time, which demonstrates current-flowing at the convergence Vth upon write back.

Instead of no selection of bit lines, when the whole array is selected, assuming that an array block size is 256 bits (BL)×2048 bits (WL)=512 kbits and that further a cell current is 1 μA/bit in the convergence Vth, a current of about 500 mA may flow in the write back method. Namely, there is a difficulty with respect to the large amount of driving currents on the write back operation in that method.

It is disclosed that channel conductance deteriorates during write back as a result of DAHE/DAHH gate current (Document 3: IEDM' 94, p.291). This is because at the convergence Vth, injections of both electrons and holes are kept through gate oxide, thus deteriorating this oxide itself.

The following prior art is given as references.

FIG. 37 is a cross-section of a semiconductor memory depicted in JP-A 10/144809(1998). In FIG. 37, since a contact structure of N++ region **12*bb* and P+ region 2*b* is overlapped with a gate region, electrons and holes generated in a part surrounded by a circle in the drawing are injected into the gate, worsening drain disturb characteristics as shown in FIG. 38**. Here, the drain disturb characteristics creates an inconvenience that the Vth goes down when drain voltage upon CHE writing is applied to a cell placed in a high Vth condition for a long time.

One example having no electric field buffer layer in a channel region is a semiconductor memory described in JP-A 4/211178(1992). This demonstrates to converge the Vth in an equivalent point between DAHE/DAHH gate currents. FIG. 39 is a graph showing current convergence characteristics upon the corresponding write back operation. FIG. 39 designates time in the horizontal axis and channel flowing current amount upon write back operation in the vertical axis, and converges a convergence value of about ~10 μA at about 10 sec, which designates an equivalent point between DAHE/DAHH gate currents. Further, the gate oxide broke down at 100 sec. This designates that both electrons and holes are simultaneously injected into the gate oxide, to develop its deterioration and cause its break-down.

Next, an erase sequence will be described as an operating method of a nonvolatile semiconductor memory.

FIG. 33 is a flow chart showing an erase sequence in a conventional NOR flash memory. In FIG. 33, ST11 designates a command input step; ST12 designates a write before erase step; ST13 designates an erase step; and ST14 designates an erase verify step.

When the command input is carried out in the step ST11, all the cells in a block selected once for erasure are written in order to prevent an occurrence of over-erased cells. Conventionally, since it took a long time for that write before erase in the erase sequence, it was difficult to shorten the erase time.

For example, in a NOR cell array to carry out write based on a CHE method, a block of 512 kbits is arranged by an architecture of 256 bits on the same bit line and 2048 bits on the same word line. Assuming that in the write before erase, 32 bits are selected at a time and that the write is performed, the write time at a time is ~20 μsec, it takes 2048/32×256×20 μs=0.328 sec for the total erase time.

Accordingly, when a chip having a capacity of 1 Mbits is configured with the above block structure, it takes 0.328 sec×2=0.65 sec for just a write before erase operation after erase command input. Though an actual erase time (an operation that brings a cell to a low Vth state) could be shortened to about 0.1 sec when a FN tunnel electric field applied to the oxide on erase was enhanced, it took approximately six times 0.1 sec for only the write before erase to keep an occurrence of over-erased cells.

Though the conventional NOR flash memory is exemplified for explanation in the above, a DINOR flash memory will be described additionally.

FIG. 40 is a schematic cross-section showing a cell structure of a conventional DINOR flash memory. In FIG. 40, since other components are the same as those in FIG. 28 except that the reference numeral 17 designates a lightly doped n-type drain region, i.e. n-drain region, like reference numerals designate identical components or corresponding parts and such description will be omitted.

The DINOR cell structure has the following features, and is different from the NOR one using the CHE write.

(1) An array structure of the DINOR flash memory may be similar to that of the above NOR flash memory.

(2) The write is performed in a low Vth state, while the erase in a high Vth state.

(3) The write operation is performed by applying a positive bias to Vd and a negative bias to Vcg, and extracting electrons from the floating gate to the drain junction region by F-N tunneling in the whole channel.

(4) The erase operation is performed by applying positive bias to vcg and a negative bias to Vsub, and injecting electrons into the floating gate by F-N tunneling.

In FIG. 42, operation voltages in DINOR flash memories are shown in the table.

Next, a write sequence will be described as a method of operating a non-volatile semiconductor memory.

The write sequence in the conventional DINOR flash memories is shown in a flow chart as shown in FIG. 41. In Fig. 41, ST21 designates a write step; ST22 designates a write verify step; ST23 designates a determining step for determining whether all bits are completed or not; and ST24 designates a write back step.

In operation, since the verify step (ST22) is carried out for each bit in the DINOR memories, the cell Vth does not reach a depletion state more than the NOR memories (over-erased state in the NOR memories, while over-written state in the DINOR memories).

Since a non-volatile semiconductor memory and a method of driving this memory are provided as described above, there are some problems that in the write back using a typical CHE method having gate voltage Vg higher than drain voltage Vd, potential generation different from that on write operation to cells is needed, bit selections of over-erased cells are required, and driving currents are large because of positive flowing of channel currents.

On the other hand, there are some merits that in the write back by self-convergence based on DAHE/DAHH gate currents, no bit selections are required, and also the potential generation may be almost the same setting as that on writing. However, there are some problems caused by the fact that it takes a long time for the convergence once a voltage-down occurs (as a typical example, extension from ~0.1 sec to 1 sec). Thus driving currents on the write back are large due to convergence currents flowing in the whole array, and the channel conductance of cells is deteriorated.

In addition, since a conventional method of operating a non-volatile semiconductor memory is provided as described above, there are some problems: a difficulty to shorten an erase time due to a long time required for the write before erase so as to control an occurrence of over-erased cells; and an occurrence of over-writing due to an accidentally accelerated write speed.

SUMMARY OF THE INVENTION

The present invention has been made to solve the foregoing problems, and it is an object of the present invention to obtain a non-volatile semiconductor memory and methods of driving, operating and manufacturing this memory to be capable of reducing a consumption current and shortening a write back operation time, and further writing back over-erased cells self-covergently and erasing back over-written cells while preventing deterioration of channel conductance.

According to a first aspect of the present invention, there is provided a method of driving a non-volatile semiconductor memory arraying a transistor including: first and second diffused layers of a second conductance type in a semiconductor substrate, opposite to each other through a channel region of a first conductance type; and a two-storied gate electrode having a floating gate and a control gate, formed through a gate insulating film on the channel region of the first conductance type, the method comprising the steps of: setting the channel region of the first conductance type and one of the first and second diffused layers at a first voltage level; setting the other of the first and second diffused layers at a second voltage level; setting the control gate at the first or a third voltage level; and injecting into the floating gate a part of charges flowing in the channel region with respect to the transistor flowing a channel current, based on a setting that a voltage difference between the first voltage level and the second voltage level is larger in absolute value than that between the first voltage level and the third voltage level.

According to a second aspect of the present invention, there is provided a method of driving a non-volatile semiconductor memory arraying a transistor including: first and second diffused layers of a second conductance type in a semiconductor substrate, opposite to each other through a channel region of a first conductance type; and a two-storied gate electrode having a floating gate and a control gate, formed through a gate insulating film on the channel region of the first conductance type, the method comprising the steps of: setting the channel region of the first conductance type at a first voltage level; setting one of the first and second diffused layers at a second voltage level; setting the other of the first and second diffused layers at a third voltage level; setting the control gate at the first, second, or a fourth voltage level; injecting into the floating gate a part of charges flowing in the channel region with respect to the transistor flowing a channel current, based on a setting that a voltage difference between the first voltage level and the second voltage level is larger in absolute value than both that between the first voltage level and the third voltage level, and that between the first voltage level and the fourth voltage level.

According to a third aspect of the present invention, there is provided a non-volatile semiconductor memory having a transistor comprising; first and second diffused layers of a second conductance type, opposite to each other through a channel region of a first conductance type in a surface of a semiconductor substrate; a two-storied gate electrode composed of a floating gate and a control gate formed through a gate insulating film on the channel region of the first conductance type; and an electric buffer layer of the second conductance type, formed between at least one of the first and second diffused layers and the channel region, wherein the diffused layer adjacent to the electric field buffer layer does not overlap with the two-storied gate-electrode.

According to a fourth aspect of the present invention, there is provided a non-volatile semiconductor memory having a transistor comprising; a first conductance region formed in a surface of a semiconductor substrate of a first conductance type, having a higher concentration than the semiconductor substrate; first and second layers of a second conductance within the first conductance region, opposite to each other through a channel region of a first conductance type; a two-storied gate electrode composed of a floating gate and a control gate formed through a gate insulating film on the channel region of the first conductance type; and an electric buffer layer of the second conductance type, formed within the first conductance region between at least one of the first and second diffused layers and the channel region, wherein the diffused layer adjacent to the electric field buffer layer does not overlap with the two-storied gate electrode.

According to a fifth aspect of the present invention, there is provided a non-volatile semiconductor memory having a transistor comprising; a first conductance region formed in a surface of a semiconductor substrate of a first conductance type, having a higher concentration than the semiconductor substrate; first and second diffused layers of a second conductance type formed within the first conductance region, opposite to each other through a channel region of the first conductance type; a two-storied gate electrode composed of a floating gate and a control gate formed through a gate insulating film on the channel region of the first conductance type; and an electric field buffer layer of the second conductance type, formed within the first conductance region between at least one of the first and second diffused layers and the channel region, wherein the first conductance region is formed by containing the electric field buffer layer and the diffused layer adjacent thereto, and wherein the diffused layer adjacent to the electric field buffer layer does not overlap with the two-storied gate electrode.

Here, the second conductance concentration of the electric field buffer layer is lower than that of the diffused layer adjacent to this buffer layer.

In addition, the transistor is applied to a NOR or DINOR flash memory.

According to a sixth aspect of the present invention, there is provided a method of manufacturing a non-volatile semiconductor memory comprising the steps of: forming a first conductance region in a surface of a semiconductor substrate of a first conductance with a higher concentration than the substrate at a predetermined depth; forming a two-storied gate electrode composed of a control gate and a floating gate on the first conductance region through a gate insulating film; forming in the surface a diffused layer of a second conductance type by an impurity injection through a mask of the two-storied gate electrode; forming sidewalls on the two sides of the two-storied gate electrode by anisotropic etching after depositing an insulating film on the whole surface; and forming first and diffused layers of the second conductance type within the range of the predetermined depth by impurity injection through a mask of the two-storied gate electrode and the sidewalls, thereby forming part of the diffused layer into an electric field buffer layer.

According to a seventh aspect of the present invention, there is provided a method of manufacturing a non-volatile semiconductor memory comprising the steps of: forming a two-storied gate electrode composed of a control gate and a floating gate on a semiconductor substrate of a first conductance type through a gate insulating film; forming a diffused layer of a second conductance type in a surface of the substrate by an impurity injection through a mask of the two-storied gate electrode; forming a first conductance region at a predetermined depth by an impurity injection with a higher concentration than the substrate so as to contain at least the diffused layer; forming sidewalls on the two sides of the two-storied gate by anisotropic etching after depositing an insulating film on the whole surface; and forming first and diffused layers of the second conductance within the range of the predetermined depth by an impurity injection through a mask of the two-storied gate electrode and the sidewalls, thereby forming part of the diffused layer into an electric field buffer layer.

Here, the step of forming the first conductance region may be carried out by an injection angle within thirty degrees to a normal line of the substrate.

According to an eighth aspect of the present invention, there is provided a method of operating a non-volatile semiconductor memory having a transistor including: first and second diffused layers of a second conductance type in a surface of a semiconductor substrate, opposite to each other through a channel region of a first conductance type; a two-storied gate electrode having a floating gate and a control gate, formed through a gate insulating film on the channel region of the first conductance type; and an electric field buffer layer of the second conductance type, formed between at least one of the first and second diffused layers and the channel region, wherein the diffused layer adjacent to the electric field buffer layer does not overlap with the two-storied gate electrode, the method comprising the steps of: verifying erase or write performance of the transistor at a predetermined threshold value or less; setting at a first voltage level the channel region of the first conductance type and one of the first and second diffused layers; setting at a second voltage level the other of the first and second diffused layers; setting at a first or third voltage level the control gate; and injecting into the floating gate a part of charges flowing in the channel region with respect to the transistor flowing a channel current, based on a setting that a voltage difference between the first voltage level and the second voltage level is larger in absolute value than that between the first voltage level and the third voltage level.

According to a ninth aspect of the present invention, there is provided a method of operating a non-volatile semiconductor memory having a transistor including: first and second diffused layers of a second conductance type in a surface of a semiconductor substrate, opposite to each other through a channel region of a first conductance type; a two-storied gate electrode having a floating gate and a control gate, formed through a gate insulating film on the channel region of the first conductance type; and an electric field buffer layer of the second conductance type, formed between at least one of the first and second diffused layers and the channel region, wherein the diffused layer adjacent to the electric field buffer layer does not overlap with the two-storied gate electrode, the method comprising the steps of: verifying erase or write performance of the transistor at a predetermined threshold value or less; setting the channel region of the first conductance type at a first voltage level; setting one of the first and second diffused layers at a second voltage level; setting the other of the first and second diffused layers at a third voltage level; setting the control gate at the first, second or a fourth voltage level; and injecting into the floating gate a part of charges flowing in the channel region with respect to the transistor flowing a channel current, based on a setting that a voltage difference between the first voltage level and the second voltage level is larger in absolute value than both that between the first voltage level and the third voltage level and that between the first voltage level and the fourth voltage level.

Here, the operating method may comprises a step of performing a write to the transistor to control an occurrence of an over-erased transistor prior to the verifying step.

DETAILED DESCRIPTION OF THE PREFERRED EMBODIMENTS

The invention will now be described with reference to the accompanying drawings.

EMBODIMENT 1

Figure 1:
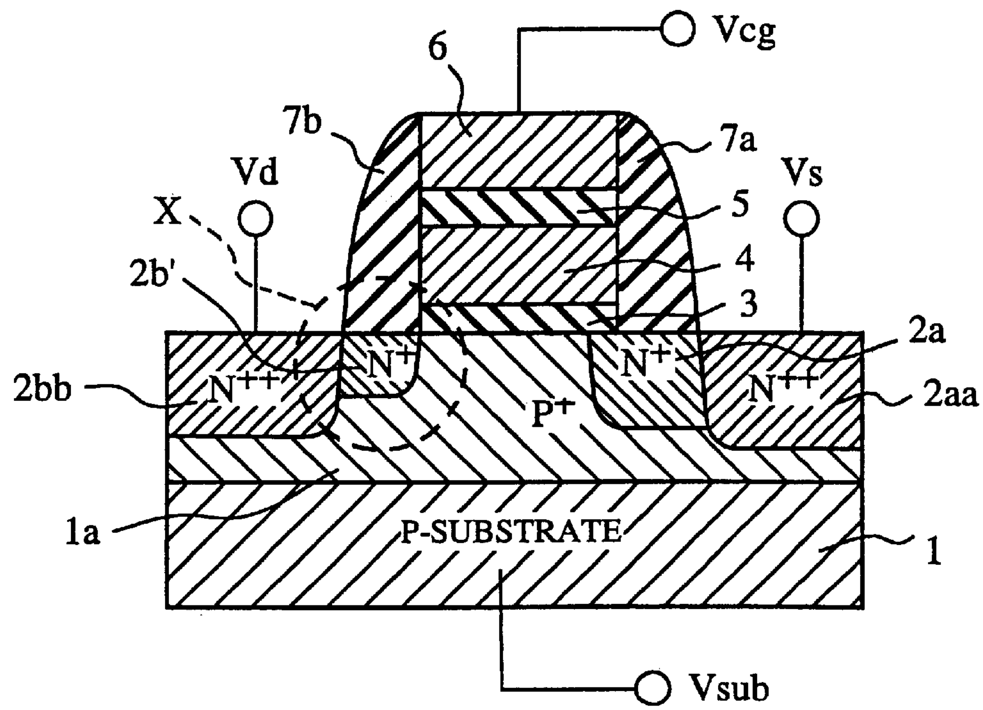
FIG. 1 is a schematic cross-section showing a NOR cell structure of a non-volatile semiconductor memory according to the embodiment 1 of the present invention.
Figure 2:
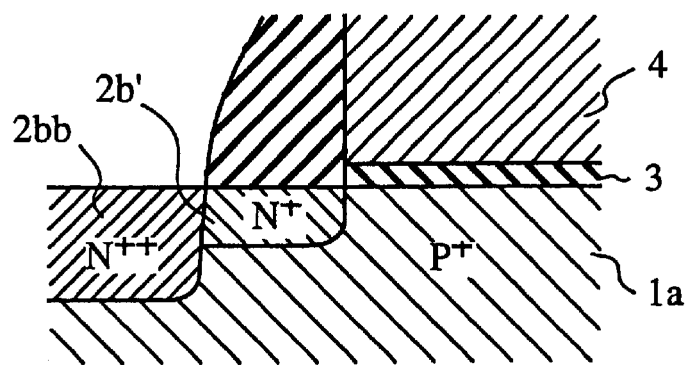
FIG. 2 is a partially enlarged sectional view showing the drain vicinity of the circle X in FIG. 1.
Figure 26:
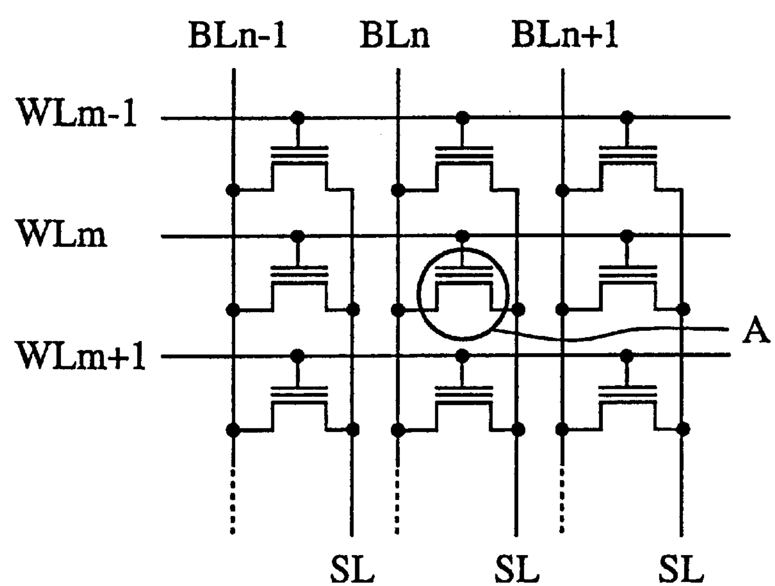
FIG. 26 is a diagram showing a cell array configuration of a NOR flash memory.
Figure 27:
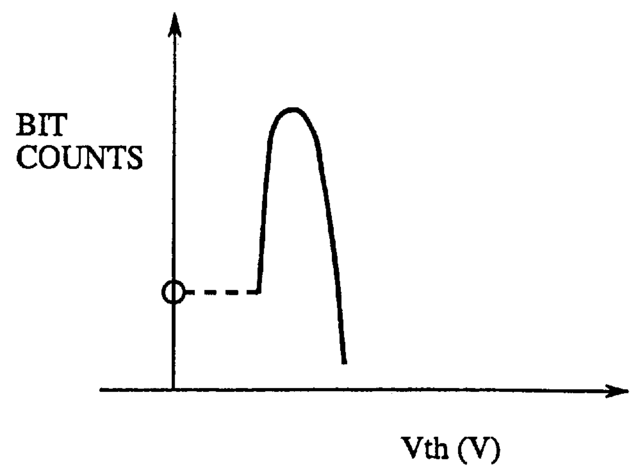
FIG. 27 is a graph showing a Vth distribution of over-erase failures according to a conventional non-volatile semiconductor memory.
Figure 28:
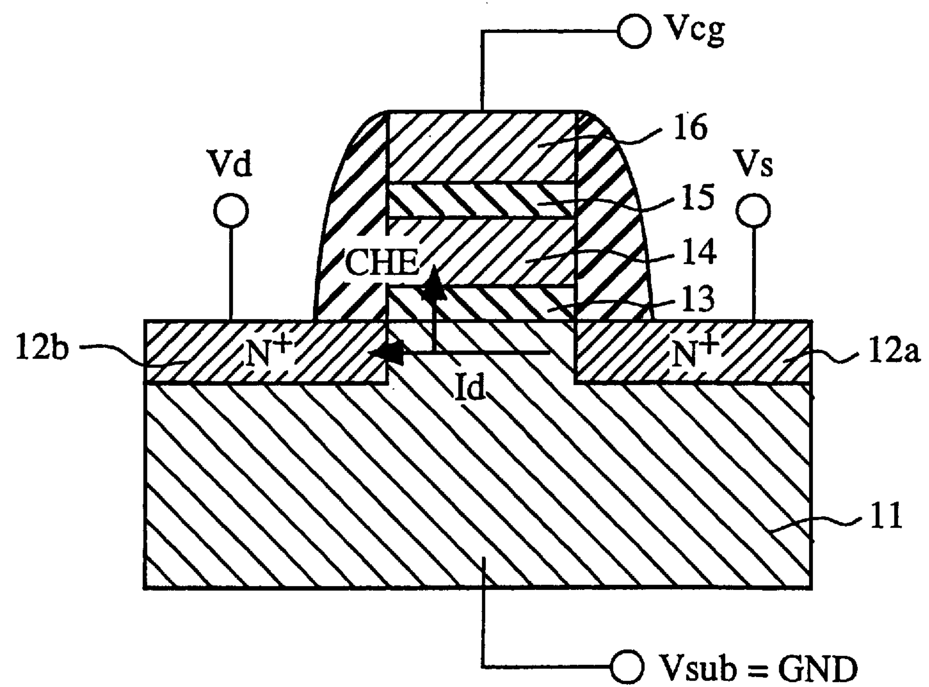
FIG. 28 is a schematic cross-section for explanation of a conventional over-erased bit write back by CHE of a non-volatile semiconductor memory.
Figure 29:
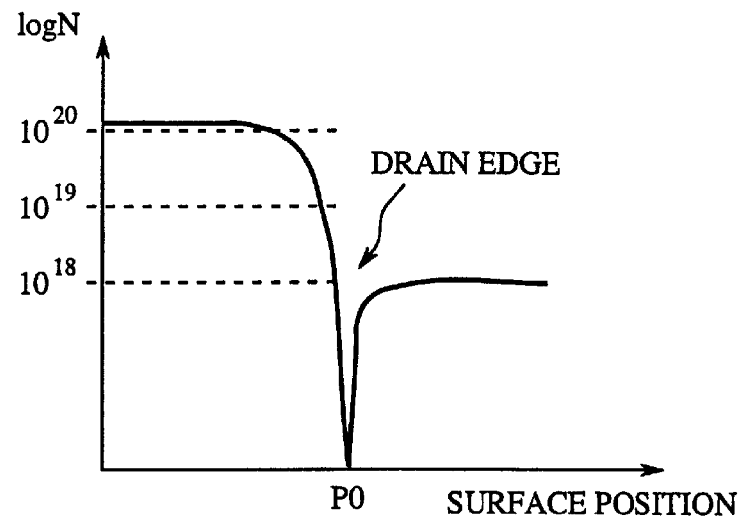
FIG. 29 is a graph showing an impurity distribution on the channel surface around the drain edge in a cell structure of a conventional non-volatile semiconductor memory.
Figure 30:
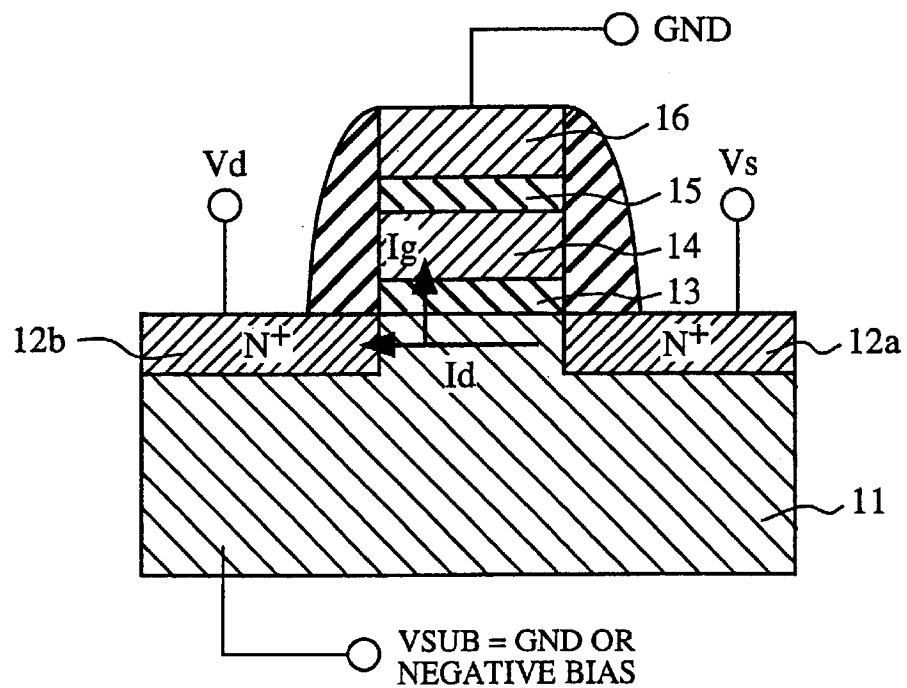
FIG. 30 is a schematic cross-section for explanation of an over-erased bit write back by DAHE/DAHH of a conventional non-volatile semiconductor memory.
Figure 31:
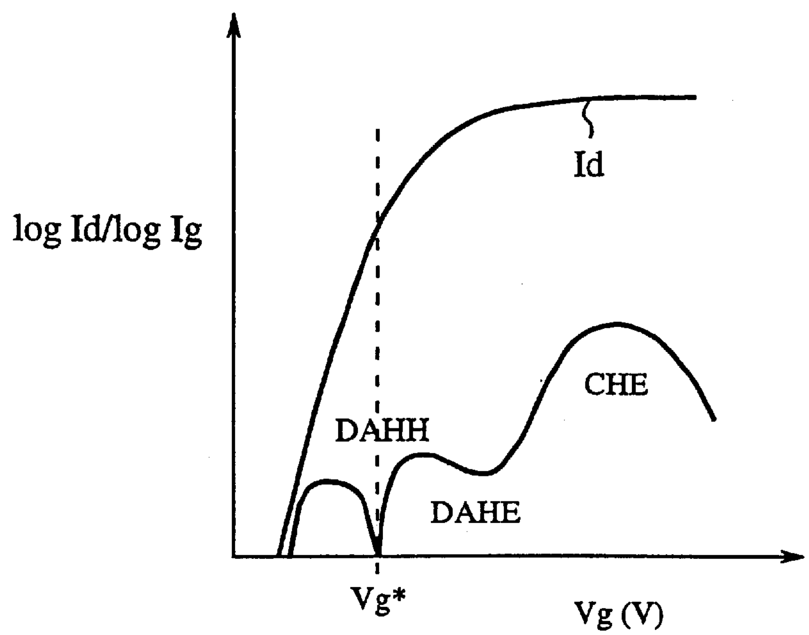
FIG. 31 is a graph showing characteristics of gate current on use of self-convergence in a non-volatile semiconductor memory.
Figure 32:
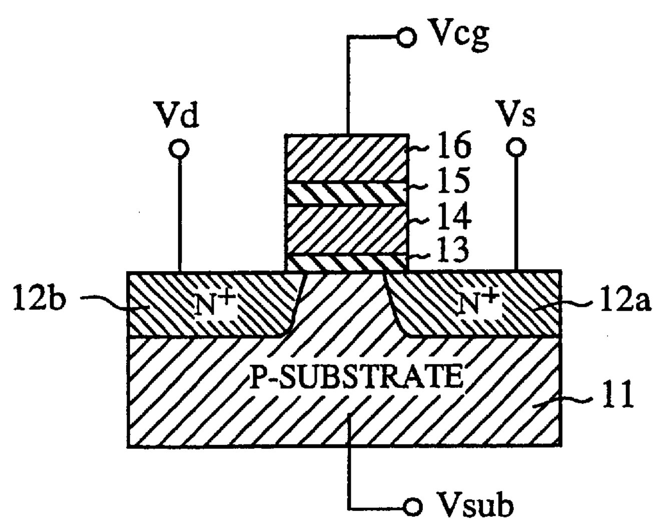
FIG. 32 is a schematic cross-section in a conventional non-volatile semiconductor memory.

FIG. 1 is a schematic sectional view showing a cell structure of a non-volatile semiconductor memory according to an embodiment 1 of the present invention, which is applied to a NOR flash memory by way of an example. FIG. 2 is an enlarged partial sectional view showing the circle X in FIG. 1, and illustrates an impurity profile in the cell structure around the drain of a cell transistor. The flash memory is disposed with a NOR array architecture, and corresponds to that of FIG. 26. FIGS. 3A–3D are process views showing a manufacturing procedure in the flash memory of FIG. 1.

In FIG. 1, the reference numeral 1 designates a p-type semiconductor substrate; 1*a* designates a p-type region of high concentration, i.e. p+ region as a first conductance type region; 2*b* designates a n-type drain region of high concentration, i.e. n+ drain region; 2*b*' designates a n+ drain region as an electric field buffer layer; 2*aa*, 2*bb* designate n-type source/drain regions, i.e. n++ source/drain regions as first/second diffused layers; 3 designates a first gate insulating film or gate dielectric such as oxide; 4 designates a floating gate composed of polysilicon and the like; 5 designates a second gate insulating film having a three-layered structure of oxide-nitride-oxide, abbreviated to ONO for countermeasure of leakage avoidance; 6 designates a control gate composed of polysilicon and the like; 7*a*, 7*b* designates side walls on source and drain sides, respectively; and 8 designates a resist. The floating gate 4, second gate insulating film 5, and control gate 6 constitute a two-storied or simply stacked gate electrode.

Hereinafter, a method of manufacturing a flash memory according to the embodiment 1 of the present invention will be described, referring to FIG. 3.

Figure 3A:
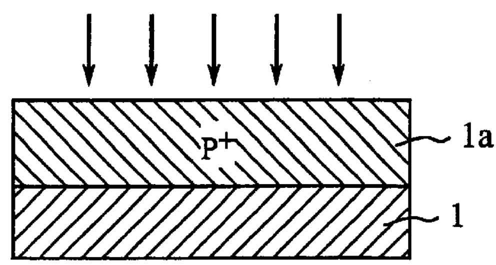
FIGS. 3A–3D are process views of a manufacturing procedure of a non-volatile semiconductor memory according to the embodiment 1 of the present invention.

First, as shown in FIG. 3A, a channel doping is carried out by an ion implantation with boron and the like so that p concentration in the surface layer of the p-type semiconductor substrate 1 becomes about $1\times10^{18}$ $^{cm-3}$. For example, depending on conditions of thermal treatment or annealing after doping, the implanted boron expands to about 0.4 $\mu$m in depth from the surface of the substrate 1 after the thermal treatment, thereby forming the p+ region 1*a*. Concretely, the p concentration of the p+ region 1*a* becomes $4\times10^{13}$/0.4 $\mu$m=$1\times10^{18}$ $cm^{-3}$ by a boron implantation of $4\times10^{13}$ $cm^{-2}$ or more.

Figure 3B:
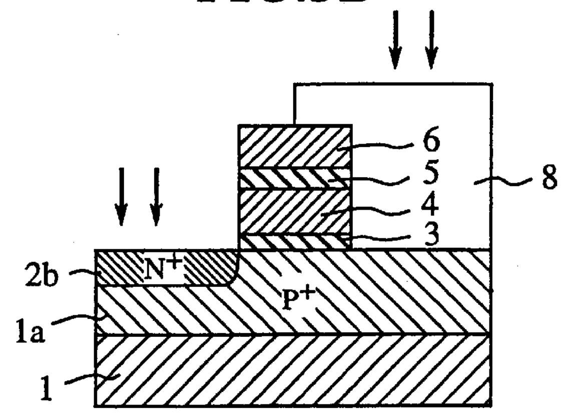

Second, as shown in FIG. 3B, the two-storied gate electrode is completed by forming the floating gate 4 through the first gate insulating film 3 on the p-type semiconductor substrate 1, and further forming the control gate 6 through the second gate insulating film 5. Subsequently, as also shown in FIG. 3B, in order to form a cell-drain structure, the n+ drain region 2*b* is formed by patterning the resist 8 and ion-implanting arsenic As and the like on only one side of the two-storied electrode, followed by thermal treatment. As a result, the n+ drain region 2*b* expands to about 0.2 $\mu$m in depth from the surface. For example, arsenic As and the like is implanted by $1\times10^{15}$ $cm^{-2}$ or less prior to formation of the side walls 7*a*, 7*b* at the next step (see FIG. 3B) so that the n+ drain region 2*b* having a concentration of about $5\times10^{19}$ $cm^{-3}$ may be obtained.

As not depicted, only the source side is opened by a resist pattern to form a n+ source structure 2*a* as well as the n+ implantation process on the drain side.

Figure 3C:
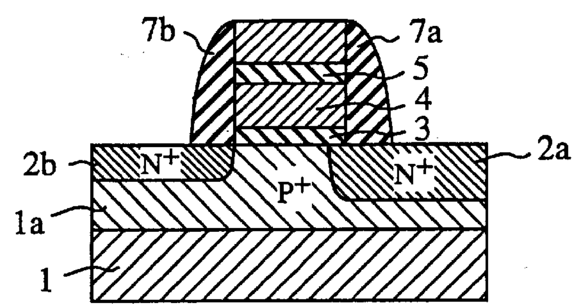
Figure 3D:
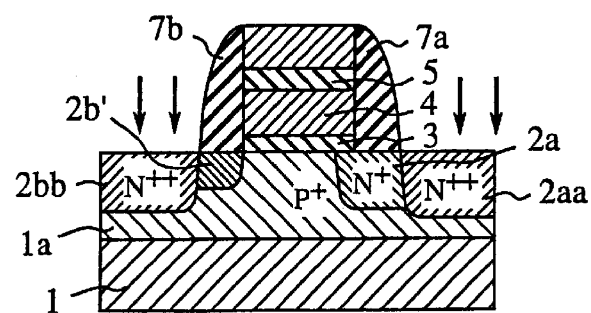

Next, as shown in FIG. 3C, an insulating film such as oxide having a predetermined thickness is formed on the top, and sidewall spacers are formed on the side of the gate electrode by blanket anisotropic etching of the insulating film. When a high-dose As and the like is ion-implanted to the surface topography as depicted in FIG. 3D, n++ source/drain regions 2*aa*, 2*bb* of higher concentration as well as the n+ drain region 2*b*' as an electric field buffer layer adjacent to these regions 2*aa*, 2*bb* are obtained by masks of the two-storied electrode and sidewalls 7*a*, 7*b*.

Thereafter, as not depicted, an interlayer dielectric is formed on the whole top, and a part of the interlayer dielectric is opened so as to reach the p-type substrate 1 provided with the N++ source region 2*aa* and drain region 2*bb*, thereby forming a contact hole. In addition, a metal film such as aluminum is deposited by vapor-deposition, sputtering, chemical vapor deposition, or the like, and the source electrode Vs and the drain electrode Vd are formed by photo-lithography by use of patterning with resists or others, so that a cell structure of the flash memory according to the present invention may be performed.

The features in the cell structure of the flash memory will be described.

As to impurity profiles in FIGS. 1 and 2, an application of LDD (Lightly Doped Drain) structure is commonly known to control hot career degradation of transistors (occurrence of drain avalanche currents). In the embodiment 1, in a memory cell of the flash memory carrying out electron writing by CHE, the n+ drain region 2*b*' having a lower concentration of the n+ diffused layer is created around the lower portion of the sidewall of the N+ drain region 2*b* in contact with the p+ region 1*a*, thus controlling an occurrence of drain avalanche currents and gaining the CHE efficiency due to a higher concentration of the p+ regions 1*a* adjacent to the n+ drain region 2*b'*.

Figure 5:
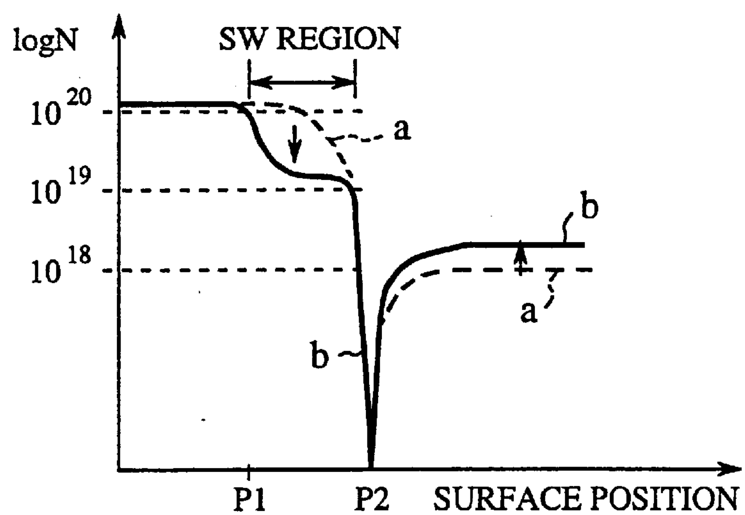
FIG. 5 is a graph showing an impurity distribution on a channel surface of the drain vicinity of a non-volatile semiconductor memory according to the embodiment 1 of the present invention.

For example, FIG. 5 is a graph showing impurity profiles on the channel surface around the drain edge of the cell structure according to the embodiment 1 of the present invention, as compared with the prior art cell structure. In FIG. 5, a dot line 'a' is a curve of the prior art cell structure, while a solid line 'b' is a curve of the cell structure of this invention; surface positions of P1 to P2 correspond to the lower portion of the sidewall 7*b* (SW region).

Here, the amount of As injection is controlled around an As concentration of As<$1\times10^{15}$ $cm^{-2}$ in the formation of the n+ drain region 2*b*. As a result, the concentration of the n+ drain region 2*b* in the lower portion of the side wall 7*b* is ensured by $1\times10^{19}$ $cm^{-3}$ or more, which maintains a lower level than $1\times10^{20}$ $cm^{-3}$ in the prior art.

With respect to an inconvenience such that due to a lowered n+ concentration of the n+ drain region 2*b*, an electric field was buffered around the drain, which degrades the CHE efficiency, that inconvenience was avoided by the p+ region 1*a* with a higher concentration ($1\times10^{18}$ $cm^{-3}$ or more) as compared with $1\times10^{18}$ $cm^{-3}$ or less in the prior art.

Further, regarding the cell structure of the NOR flash memory, it was established so that the concentration of the neighboring P+ region 1*a* around the drain was $1\times10^{18}$ $cm^{-3}$ or more, and the concentration of the n+ drain region 2*b* in contact with the p+ region 1*a* was $1\times10^{20}$ $cm^{-3}$ or less. As a result, there were provided characteristics of cutting off channel currents in the convergence Vth.

Next, the operation of the cell structure of the above invention will be described.

The write to cells, by a CHE method, is carried out in such a manner that high-energy electrons accelerated over the barrier height of the first gate insulating film 3 are injected into the floating gate 4, among channel electrons accelerated by a steep electric field around the drain. On the other hand, the write back to cells is carried out in such a manner that the drain voltage Vd as well as on the write is applied to all bit lines, and that the gate potential Vcg is held in, e.g. GND level (0 V) (Vs=Vsub=GND).

As a result, over-erased cells may be written back self-convergently so that the channel currents upon the convergence are cut off. In addition, it is possible that the application of a back gate potential (negative bias) to the substrate enhances the CHE write efficiency (Vs=GND, Vsub<0 V)

As described above, since a non-volatile semiconductor memory such as flash memories according to the embodiment 1 of the present invention includes the aforementioned cell structure, the cell Vth of the convergence Vth or less may be selectively written back up to the convergence Vth at a high speed, without passing the conventional steps of providing a potential to all the bit lines of a cell array, and selecting the over-erased cells with keeping all the control gates at GND level. Further, since the cell currents are cut off in the convergence Vth condition, the consumption currents may be controlled in accordance with that Vth convergence.

Next, a method of erasing a non-volatile semiconductor memory according to the embodiment 1 of the present invention will be described.

Figure 4:
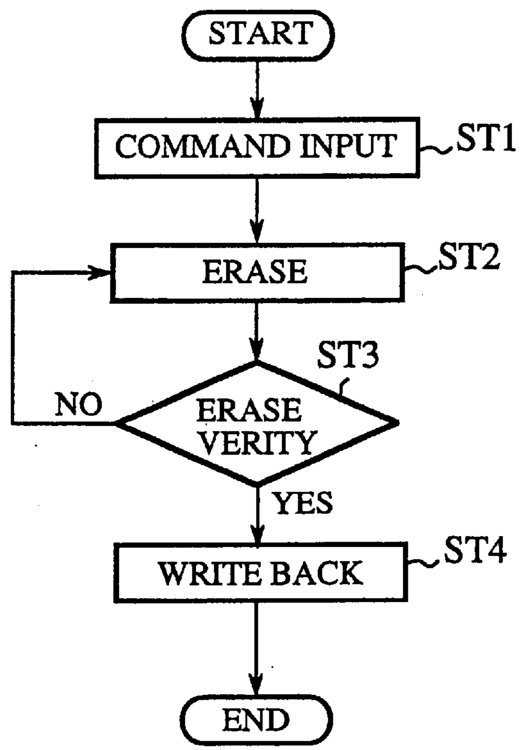
FIG. 4 is a flow chart showing an erasure sequence of a non-volatile semiconductor memory according to the embodiment 1 of the present invention.

FIG. 4 is a flow chart illustrating an erasure sequence according to the aforementioned flash memory. In FIG. 4, ST1 designates a command input step; ST2 designates an erase step; ST3 designates an erase verify step; and ST4 designates a write back step.

Next, the operation will be described.

When an input command is input at the step ST1 at the start of the erasure sequence, the erase verify step ST3 is carried out without a write before erase. After all the bits are verified to a certain Vth or less, the write back step ST4 starts and then reaches the end of the erasure sequence.

It should be noted that the write back step ST4 does not deteriorate the cell characteristics, and is different from the conventional write back by DAHE/DAHH gate current. A sufficient time required for the write back step ST4 is around ~10 msec. Consequently, even if the write before erase step ST12 is skipped, which takes the longest time at a conventional erase operation-time, the occurrence of over-erased cells is controlled, and the erase time is shortened to 0.1 sec (erase)+0.01 sec (write back)=0.11 sec. The effect of that erase time shortening appears remarkably with increase of integration degree (that is, the more the number of bits/blocks), and contributes greatly the improvement of an access speed in the entire memory.

Figure 6:
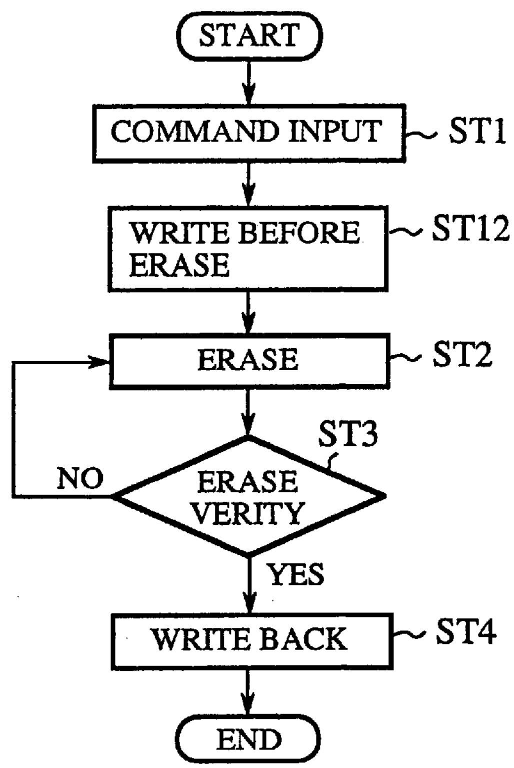
FIG. 6 is a flow chart showing another erasure sequence of a non-volatile semiconductor memory according to the embodiment 1 of the present invention.
Figure 33:
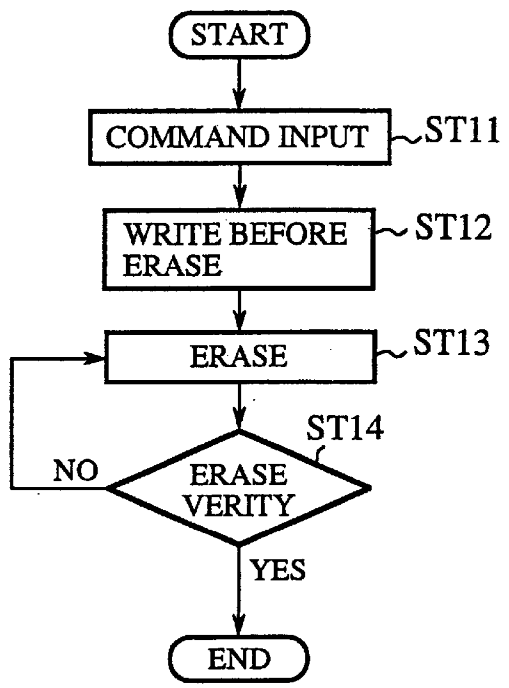
FIG. 33 is a flow chart showing a NOR-type erasure sequence of a conventional non-volatile semiconductor memory.
Figure 34:
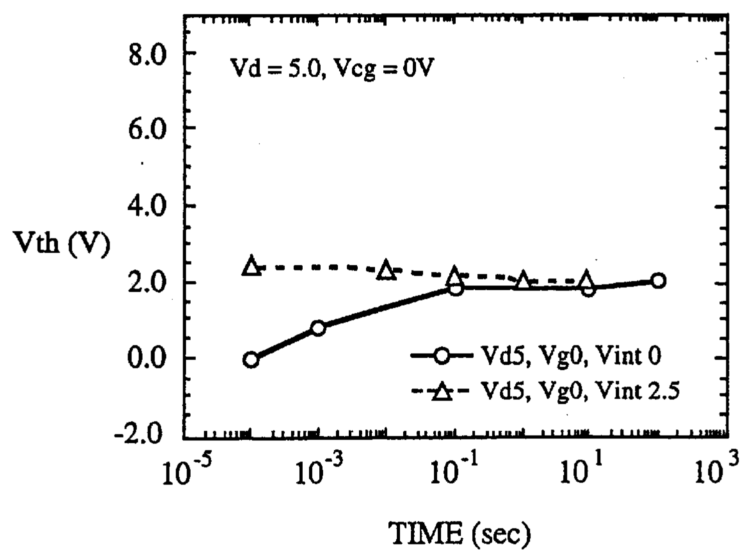
FIG. 34 is a graph showing a write back by self-convergence according to a conventional non-volatile semiconductor memory.
Figure 35:
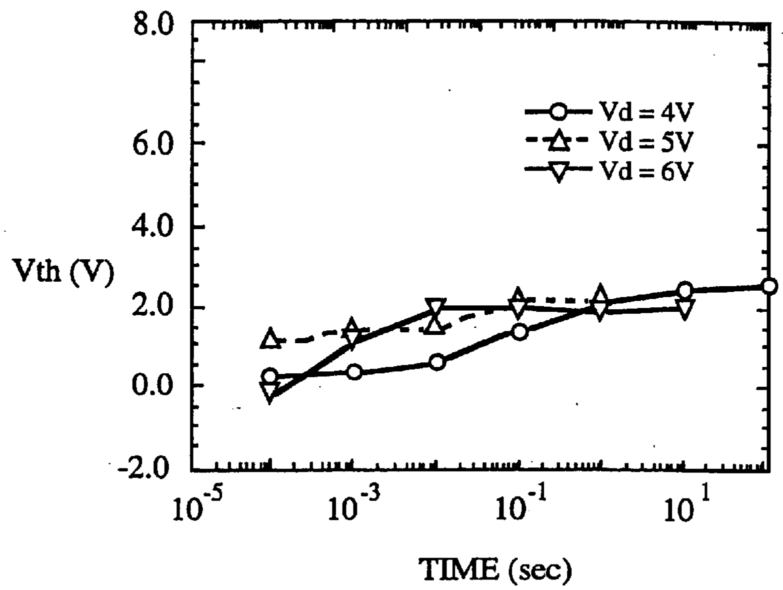
FIG. 35 is a graph showing a write back by self-convergence according to a conventional non-volatile semiconductor memory.
Figure 36:
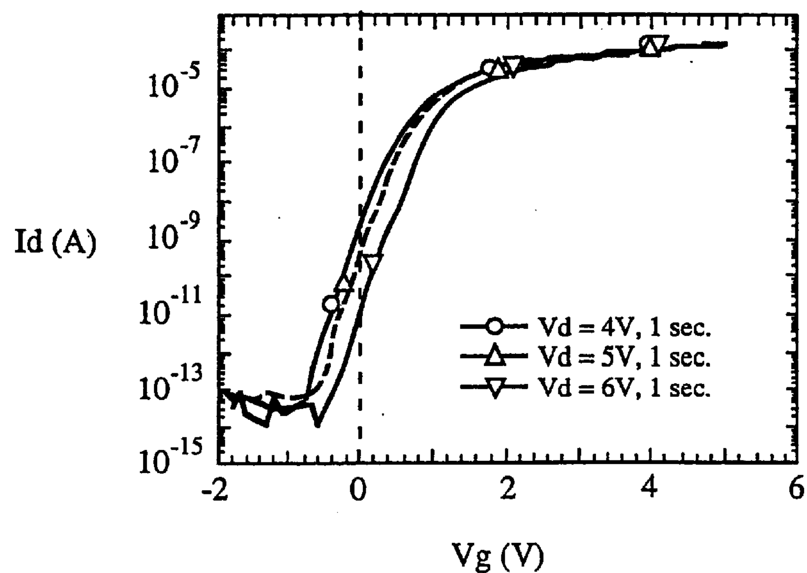
FIG. 36 is a graph showing a write back by self-convergence according to a conventional non-volatile semiconductor memory.
Figure 37:
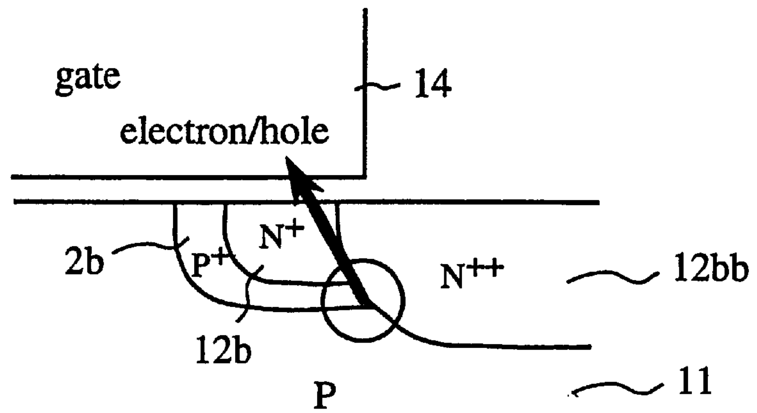
FIG. 37 is a cross section for explanation illustrating an occurrence of DAHE/DAHH according to a conventional non-volatile semiconductor memory.
Figure 38:
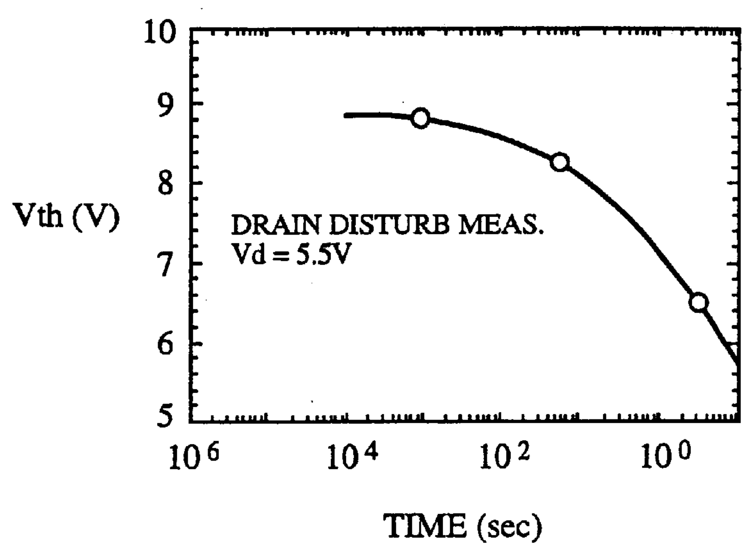
FIG. 38 is a graph showing drain disturb characteristics according to a conventional non-volatile semiconductor memory.
Figure 39:
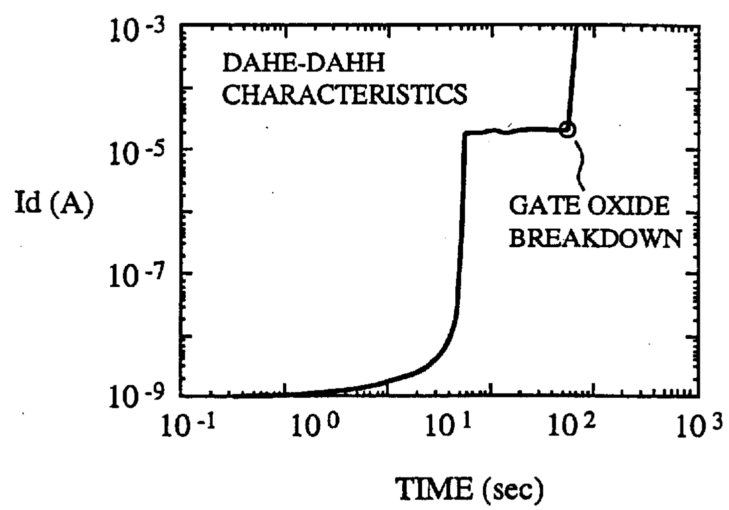
FIG. 39 is a graph showing characteristics of current-convergence upon a write back operation according to a conventional non-volatile semiconductor memory.
Figure 40:
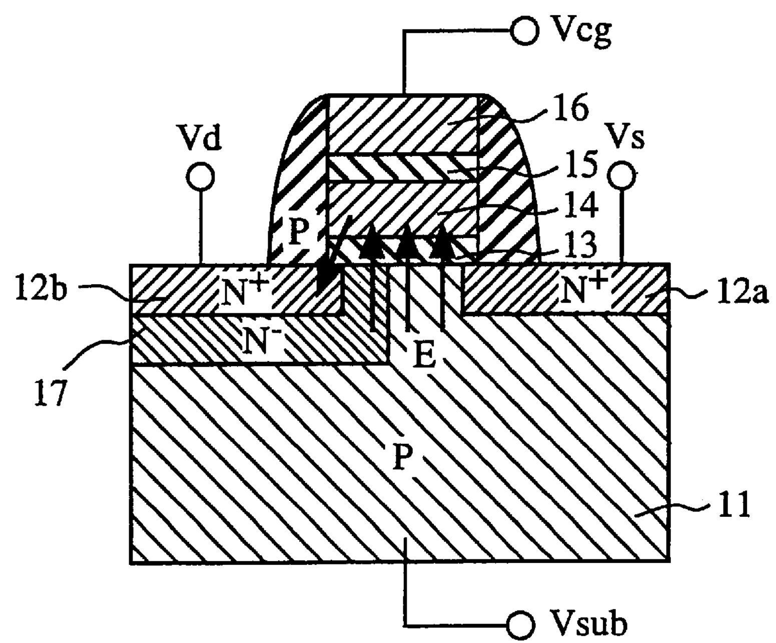
FIG. 40 is a schematic diagram showing a DINOR cell structure according to a conventional non-volatile semiconductor memory.

Needless to say, the effect of the same erase-time shortening as above is obtained in the flow chart of FIG. 6 incorporating the write before erase ST12 as shown in FIG. 33.

Hereinafter, it is described that the cell write back in the flash memory according to the embodiment 1 of the present invention is carried out only by CHE, referring to the attached graphs.

Figure 7:
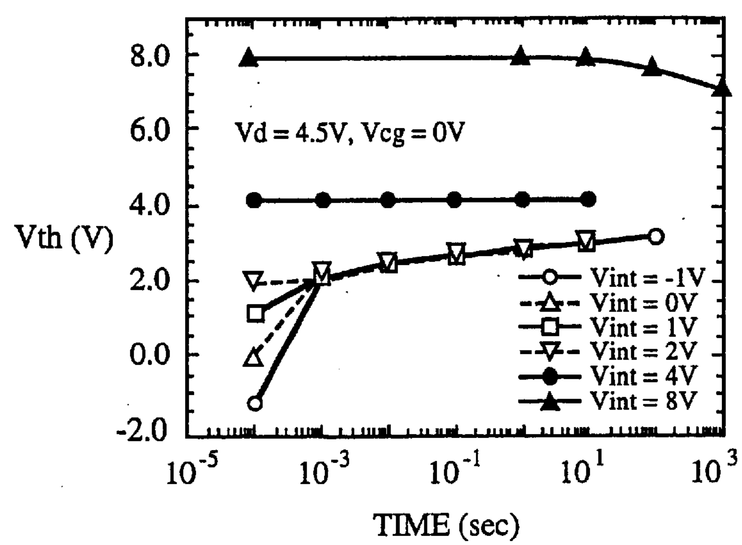
FIG. 7 is a graph showing characteristics of convergence/write back of a non-volatile semiconductor memory according to the embodiment 1 of the present invention.

FIG. 7 is a graph showing the characteristics of convergence and write back in a cell of flash memories of the embodiment 1. In the measurements relating to FIG. 7, the potential setting is provided with Vd=4.5 V, Vcg=0 V, and Vs=Vsub=GND like the write back by DAHE/DAHH gate current. It is apparent that the cell Vth in the depletion regime is written back to Vth>2.0 V after about 1 msec.

Figure 8:
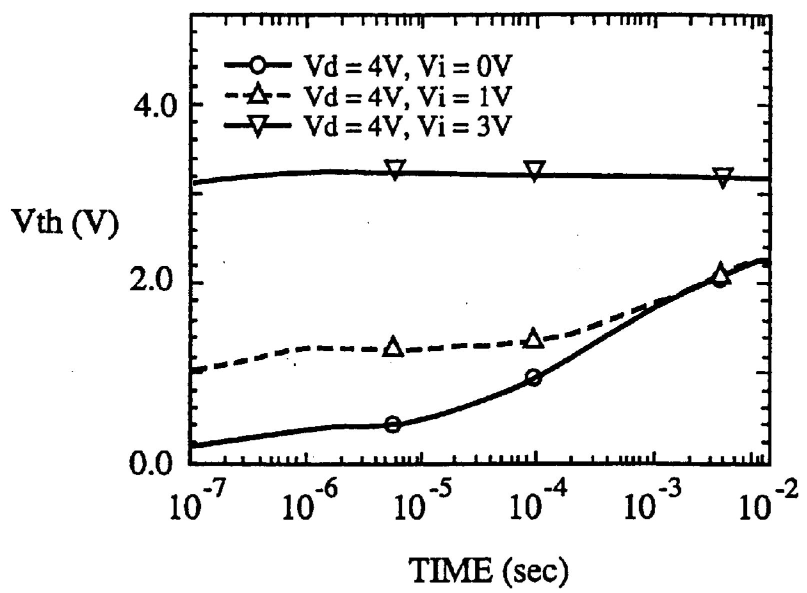
FIG. 8 is a graph showing characteristics of convergence/write back of a non-volatile semiconductor memory according to the embodiment 1 of the present invention.

FIG. 8 is a graph showing results of write back measurements at a write back time even shorter than FIG. 7. It is apparent that the write back time which took about 0.1 sec in the conventional write back by DAHE/DAHH gate current was shortened by about three orders in time as about 0.1 msec.

Further, in the cell write back of the embodiment 1, no cell Vth having the convergence Vth or more goes down, which is different from the prior art, though a potential is provided for the drain only with keeping a gate potential of 0 V as well as the conventional write back by DAHE/DAHH gate current (see FIG. 7). This is because the occurrence of drain avalanche is controlled and the CHE efficiency is improved.

Figure 9:
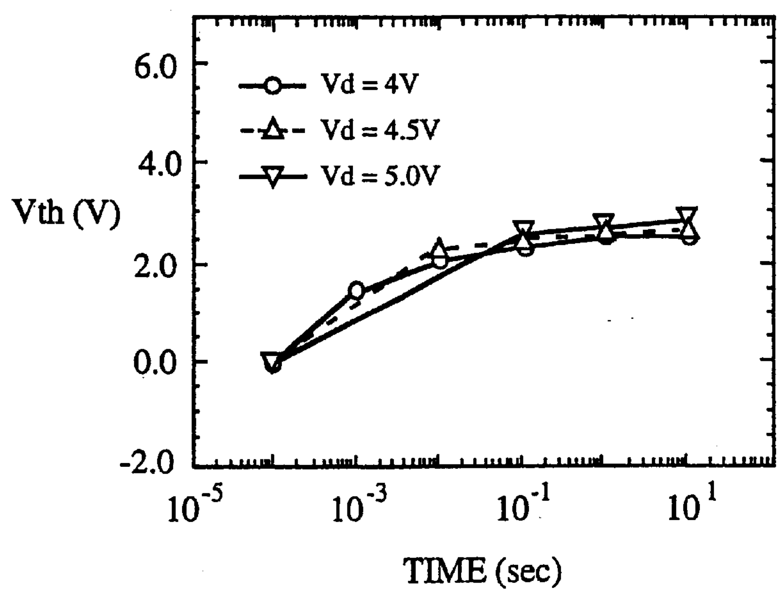
FIG. 9 is a graph showing characteristics of write back of a non-volatile semiconductor memory according to the embodiment 1 of the present invention.

FIG. 9 shows dependency of drain voltage in the write back of the present method. As compared with the prior art, a high-speed write back is carried out even in vd=4 V.

Figure 10:
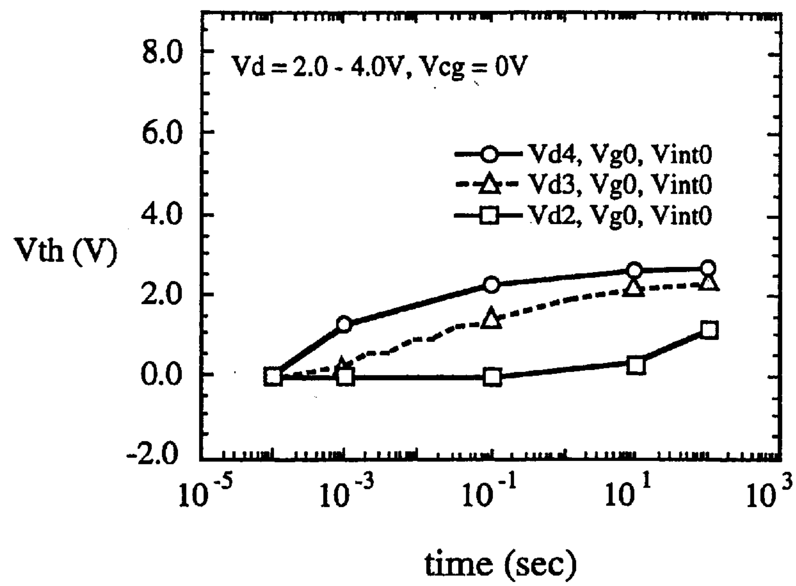
FIG. 10 is a graph showing characteristics of write back of a non-volatile semiconductor memory according to the embodiment 1 of the present invention.

Further, FIG. 10 shows one example of the write back in a low voltage of Vd (2–4 V).

Figure 11:
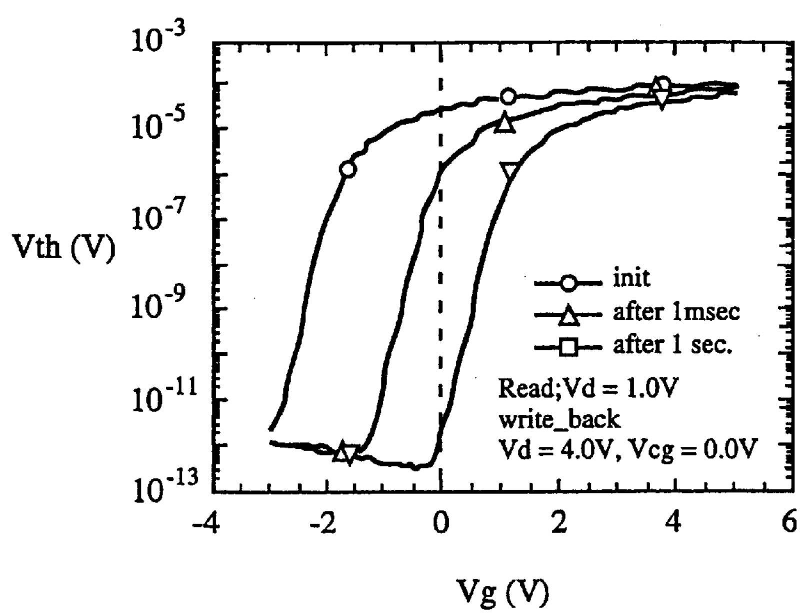
FIG. 11 is a graph showing Vg-Vth characteristics on convergence in a method of driving a non-volatile semiconductor memory according to the embodiment 1 of the present inventionl.

FIG. 11 is a graph showing Vg-Vth measurement results in a cell in a convergence state of write back. It is apparent from FIG. 11 that channel currents are cut off in a convergence cell, and is different from a conventional write back by DAHE/DAHH gate current. Thus, in the conventional write back by DAHE/DAHH gate current, a current of about 500 mA keeps flowing in 512 kbits array during the write back for about 0.1 sec, while the current is cut off in accordance with the convergence according to the present invention. Consequently, the consumption current is remarkably reduced as compared with the prior art.

Figure 12:
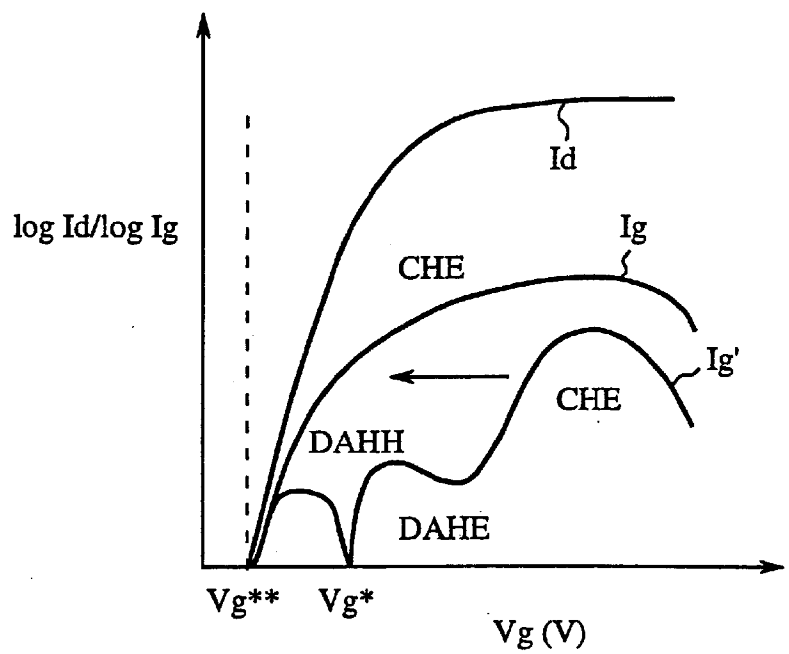
FIG. 12 is a graph showing gate current characteristics on convergence in a method of driving a non-volatile semiconductor memory according to the embodiment 1 of the present invention.

FIG. 12 is a graph of gate current characteristics on using the above convergence method. Here, Ig designates a gate current in a new cell structure, while Ig' designates a gate current in a conventional cell structure. According to the present invention, after a curve on the side of the gate current Ig rises steeply from Vg point, then it converges gradually and conforms the curve of drain current Id. On the other hand, a curve on the side of gate current Ig' in a conventional structure has mountains and valleys, such that it falls down to log(Id/Ig)=0 with transiting from Vg to vg* point with an increase of gate voltage Vg, and then rises and goes down slightly.

From the experimental results, it is considered that the DAHH/DAHE gate currents are controlled due to employment of the aforementioned cell-drain structure, and the CHE efficiency is improved in a cut above the prior art. Namely, with the above structure, of subthreshold leak currents flowing in a channel region components accelerated by energy are injected into the floating gate as gate currents. As a result, the potential of the floating gate goes down, and the cell Vth converges in a channel cut-off state. Namely, this results in carrying out the write back by the CHE of the subthreshold leak currents.

Figure 13:
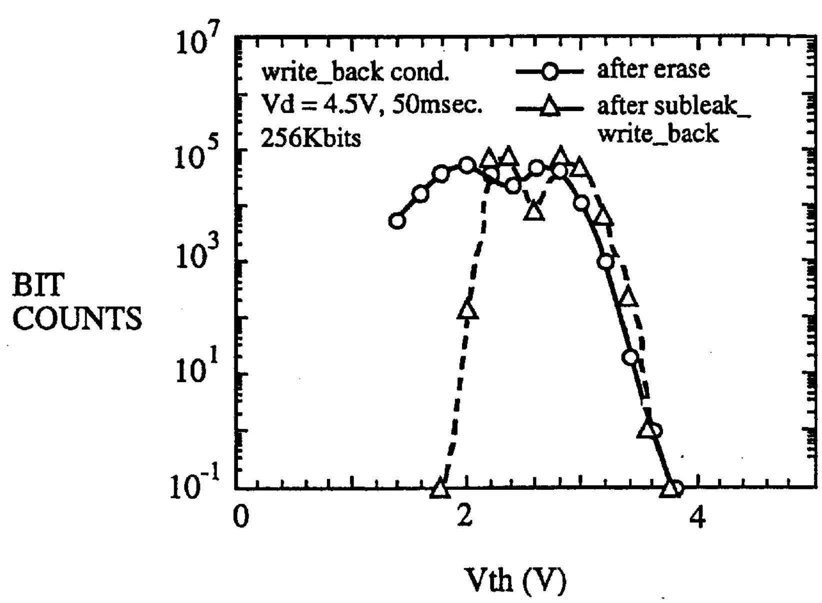
FIG. 13 is a graph illustrating one example of write back in a method of driving a non-volatile semiconductor memory according to the embodiment 1 of the present invention.

FIG. 13 shows one example of write back in a 256 kbits array employing the cell structure according to the embodiment 1. It is apparent that the Vth distribution causing over-erase after erase was written back to Vth>2 V or more. Namely, a phenomenon in a simple cell was verified the cell array.

As described above, according to the embodiment 1, the cell-drain structure is constituted as follows: there is provided the n+ diffused region as an electric buffer layer having a concentration lower than the n++ diffused region of the drain in contact with the p-type region of high concentration; and the p-type region from the channel region includes the n++ diffused region and n+ diffused region, thereby controlling the occurrence of drain avalanche holes/electrons and improving the CHE efficiency. Thus, in the non-volatile semiconductor memory such as flash memory having an array structure, a selection of over-erased cells is not required, and the cell Vth less than the convergence Vth is written back to the convergence Vth at a high speed, thereby improving an access time of the memory.

In addition, since the cell current is cut off in the convergence Vth condition, the consumption current is controlled in accordance with converging the Vth, thereby reducing the consumption power in the entire memory.

Further, in the above structure, when the above write step is employed instead of abbreviation of the write before erase, a high-speed of the erasure sequence may be attained, and since avalanche holes/electrons are not injected into the control gate through the first insulating film, channel conductance degradation may be prevented.

Furthermore, since the dielectric break-down of a tunnel oxide as the first insulating film may be avoided, the product life of the memory may be improved.

EMBODIMENT 2

Figure 14:
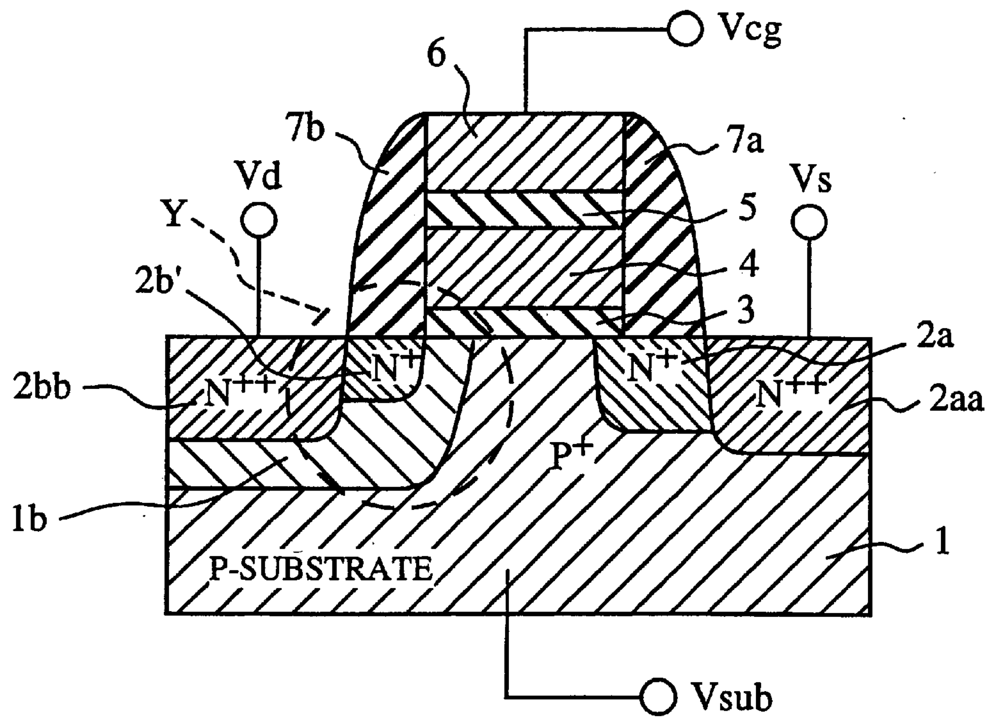
FIG. 14 is a schematic cross-section showing a NOR cell structure of a non-volatile semiconductor memory according to the embodiment 2 of the present invention.
Figure 15:
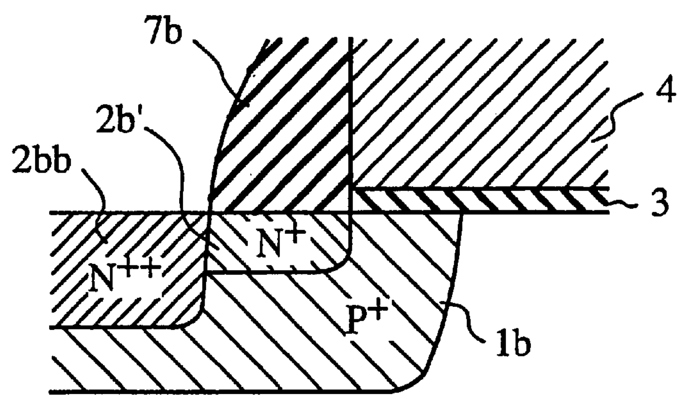
FIG. 15 is a partially enlarged sectional view showing the drain vicinity of the circle Y in FIG. 14.
Figure 16A:
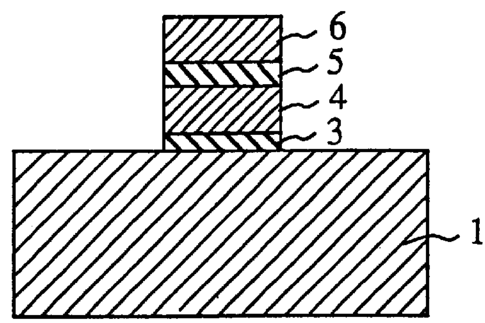
FIGS. 16A–16C are process views of a manufacturing procedure of a non-volatile semiconductor memory according to the embodiment 2 of the present invention.
Figure 16B:
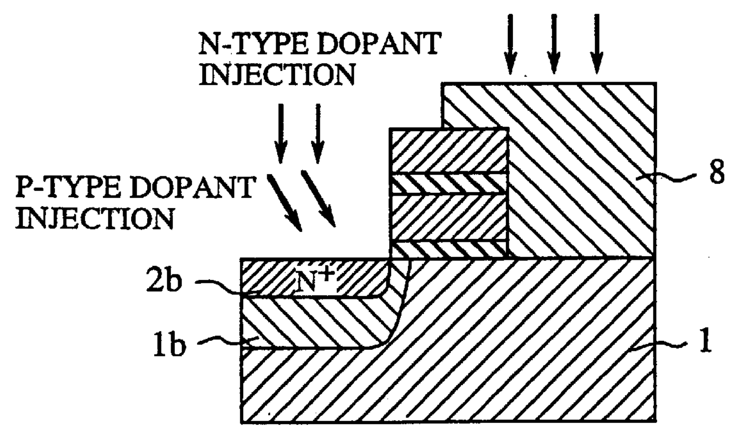
Figure 16C:
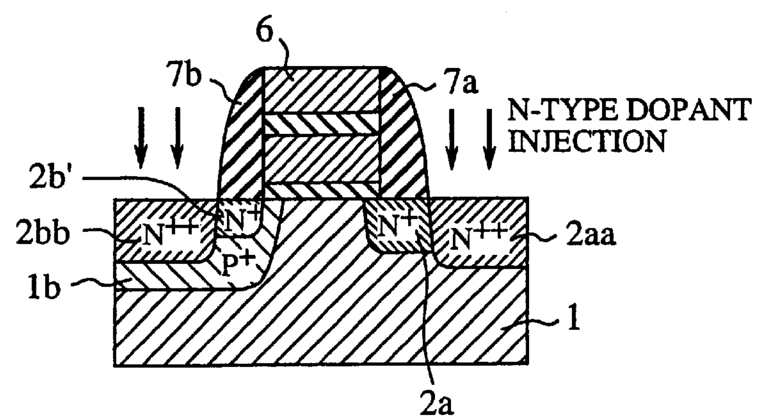

FIG. 14 is a schematic cross-section showing a non-volatile memory according to the embodiment 2 of the present invention, and applied to a NOR flash memory as well as the aforementioned embodiment 1. FIG. 15 is a partially enlarged view of the circle Y in FIG. 14, illustrating impurity profiles in a cell structure around the drain of a cell transistor. FIGS. 16A–16C are process views showing a manufacturing procedure of the flash memory in FIG. 14.

In the drawings, the reference numeral 1*b* designates a p+ pocket region of high p concentration as a first conductance region, and since other components are the same as the embodiment 1, the same components are denoted with the same reference numerals and these descriptions will be omitted.

Hereinafter, referring to FIGS. 16A–16C, a method of manufacturing a flash memory according to the embodiment 2 of the present invention will be described.

As shown in FIG. 16A, a floating gate 4 is formed through a gate insulating film 3 on a p-type semiconductor substrate 1, and a control gate 6 is formed thereon through a second gate insulating film 5, thereby completing a two-storied electrode.

Subsequently, as shown in FIG. 16B, in order to form a cell-drain structure, only one side of the two-storied electrode is ion-implanted with arsenic As as a n-type dopant through patternings of a resist 8 to form the n+ drain region 2*b*, and successively is ion-implanted obliquely with boron or the like as a p-type dopant to form the p+ pocket region 1*b*.

As not depicted, only the source side is opened by a resist pattern to form a n+ source structure 2*a* as well as the n+ implantation process on the drain side.

Next as shown in FIG. 16C, an oxide with a predetermined thickness is formed on the top, the oxide is subjected to anisotropic blanket etching, and sidewalls 7*a*, 7*b* are formed on the sides of the gate. When the top of this topography is ion-implanted with a high-dose arsenic As or the like, the n++ source and drain regions of still higher concentration as well as the n+ drain region 2*b*' as an electric field buffer layer adjacent to these regions 2*aa*, 2*bb* are obtained with masks of the two-storied electrode and the sidewalls 7*a*, 7*b*.

Thereafter, as in the embodiment 1, a contact hole is formed in a formed interlayer dielectric, and a source electrode Vs and a drain electrode Vd are formed through the hole, thereby completing the cell structure of the flash memory according to the present invention. Here, an operation of the cell structure and the content of the erasure sequence of the flash memory using this are the same as the embodiment 1, and the descriptions will be omitted.

The cell structure of the flash memory is almost the same as the embodiment 1 above, and is distinguishable from the embodiment 1 in that the p+ pocket region 1*a* is created by boosting p concentration selectively only around the cell-drain, resulting in the effect like the above embodiment 1 without enhancing the cell Vth beyond necessity. In the embodiment 1, the p+ region of high concentration is formed on the whole surface of the p-type semiconductor substrate 1.

As described above, according to the embodiment 2, in addition to the effect of the embodiment 1, the memory may be operated stably as usual without enhancing the cell Vth beyond necessity.

EMBODIMENT 3

Figures 17, 18:
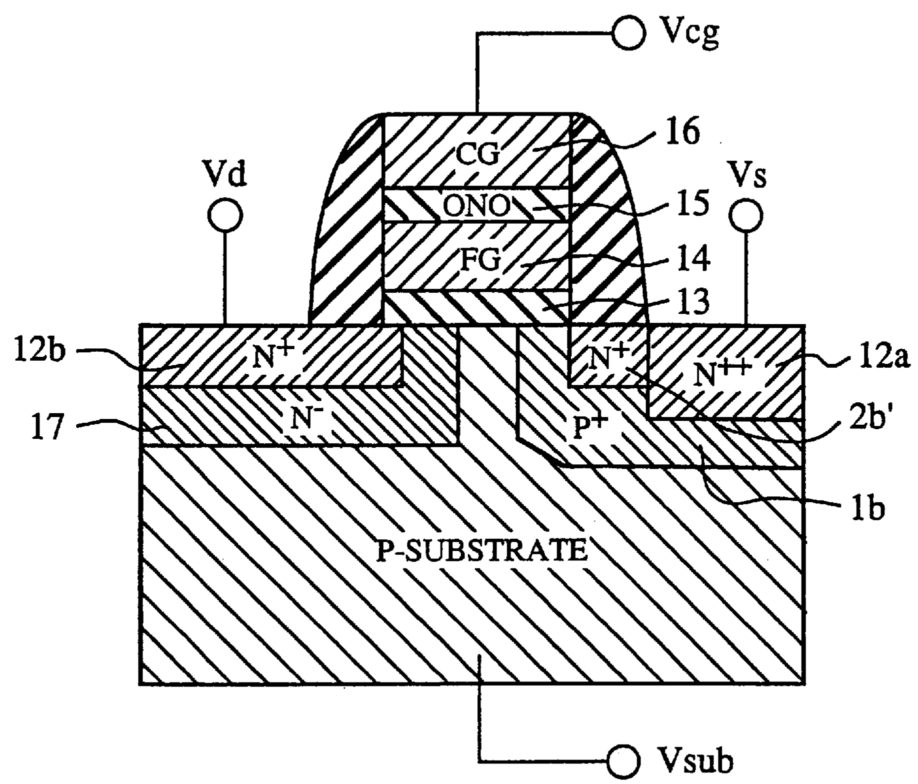
FIG. 17 is a schematic cross-section showing a DINOR cell structure of a non-volatile semiconductor memory according to the embodiment 3 of the present invention.
FIG. 18 is a table showing settings of operation voltages of a non-volatile semiconductor memory in FIG. 17.

FIG. 17 is a schematic cross-section showing a cell structure of a non-volatile semiconductor memory according to the embodiment 3 of the present invention, and is applied to a DINOR flash memory by way of example. A feature of this structure exists: A p+ pocket region 1*b*, as shown in the cell structure of the embodiment 2 above, is prepared on the source side instead of the drain side, and a N+ drain region 2*b* is provided in the region 1*b*. Accordingly, the description of the reference numerals and that manufacturing method will be omitted. The operation voltages in the DINOR flash memory according to the embodiment 3 of the present invention are shown in a table.

Figures 41, 42:
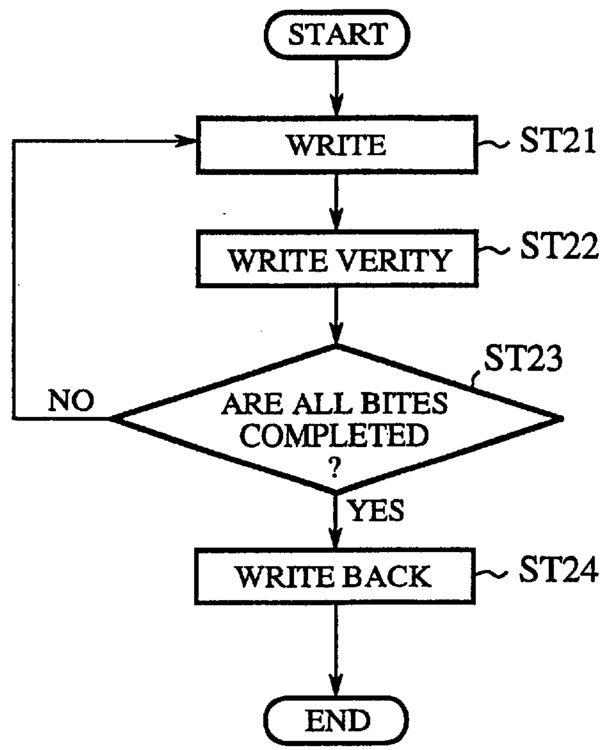
FIG. 41 is a flow chart showing a DINOR-type write sequence of a conventional non-volatile semiconductor memory.
FIG. 42 is a table showing settings of operation voltages in DINOR-type of a conventional non-volatile semiconductor memory.

Conventionally, for example, the write back is carried out by application of drainvd=7 V and gate Vcd=8 V. However, by application of the cell structure of the present invention, in the conventional write sequence of the DINOR flash memory as referred to FIG. 41, when the cell is rendered in over-programming or depletion state, there is no need of so called "bit selection" that generates a potential different from DINOR write/erase in the cell and writes back this by CHE. Therefore, the write back based on the operation voltage settings in FIG. 18 may erase back selectively over-written cells, or go back the Vth to an enhancement state by just applying a potential of 5–6 V to the source for about 10 msec.

As described above, according to the embodiment 3, the cell in a depletion state or over-written cell is just applied to the source at a predetermined voltage, and it may be saved self-convergently with no need of the bit selection.

Hereinafter, it will be discussed as the flash memories according to the above embodiments 1 to 3 are compared in characteristics with the prior art.

Figure 19:
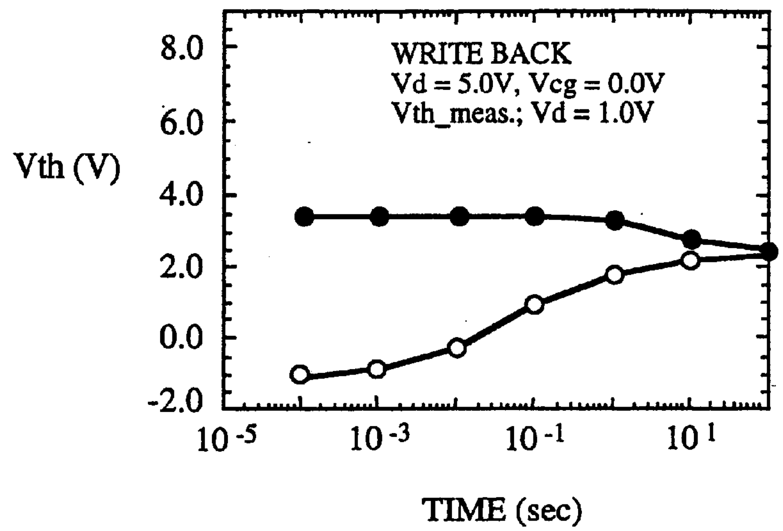
FIG. 19 is a graph showing an evaluation of characteristics of DAHE/DAHH write back in a conventional non-volatile semiconductor memory.
Figure 20:
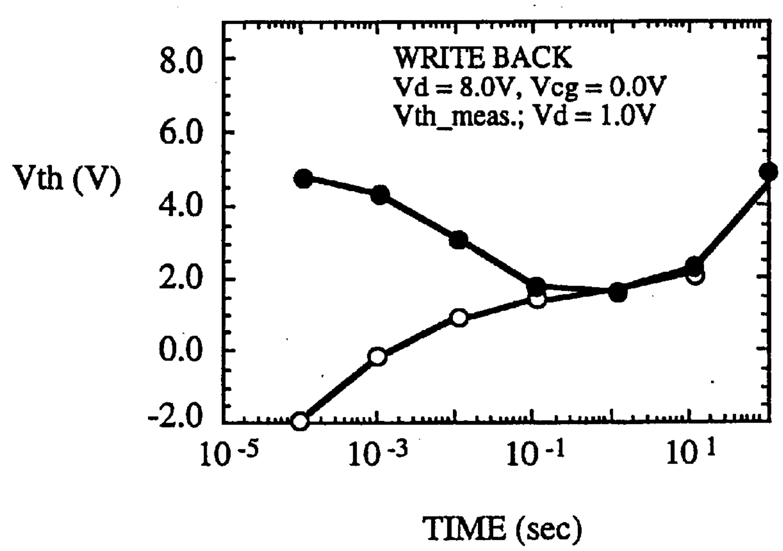
FIG. 20 is a graph showing characteristics of DAHE/DAHH write back in a conventional non-volatile semiconductor memory.
Figure 21:
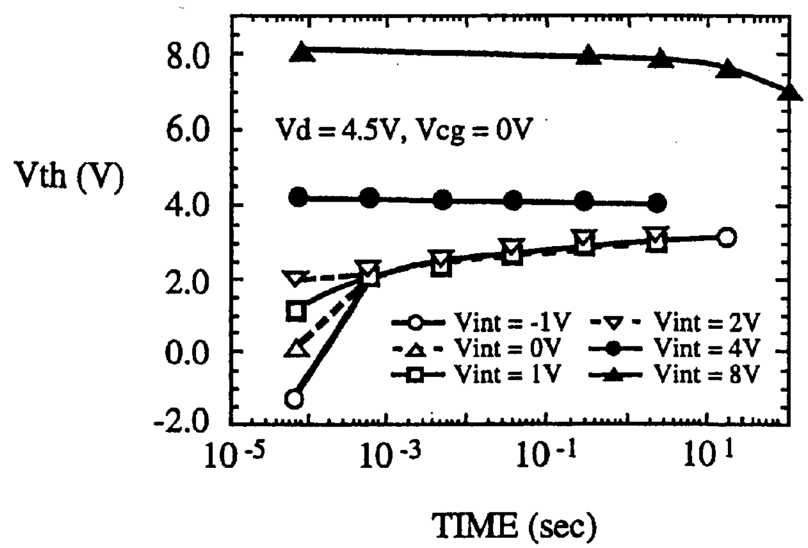
FIG. 21 is a graph showing characteristics of DAHE/DAHH write back according to the embodiments 1 to 3 of the present invention.
Figure 22:
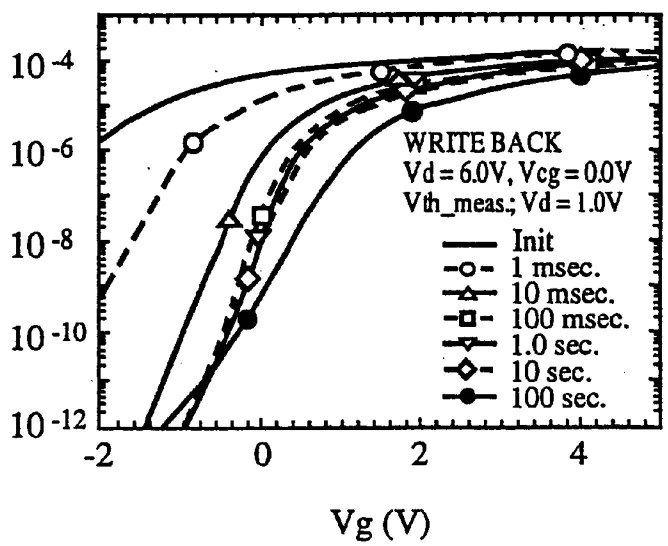
FIG. 22 is a graph showing Vg-Id characteristics in a conventional non-volatile semiconductor memory.
Figure 23:
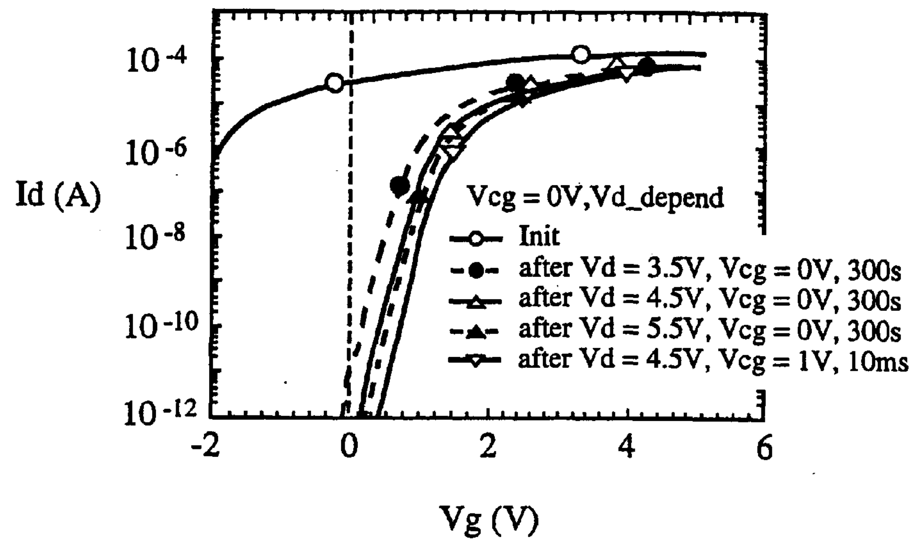
FIG. 23 is a graph showing characteristics of Vg-Id on convergence according to the embodiments 1 to 3 of the present invention.
Figure 24:
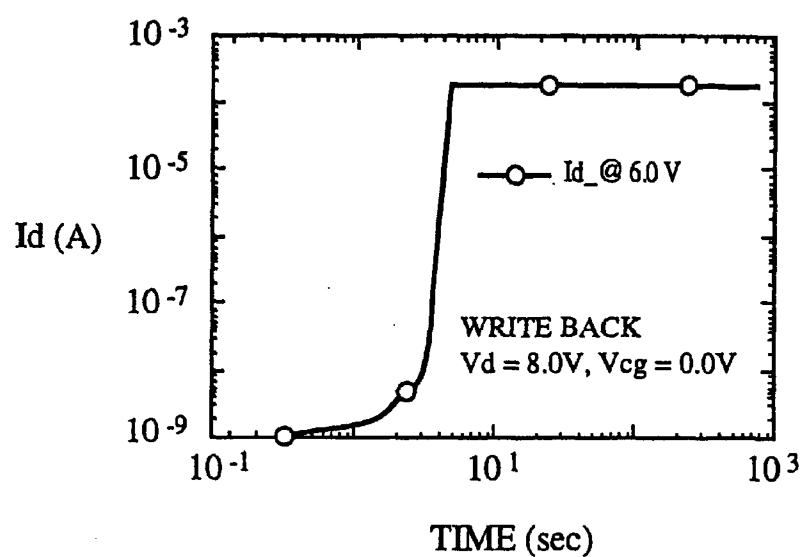
FIG. 24 is a graph showing Vg-Id characteristics in a conventional non-volatile semiconductor memory.

FIGS. 19, 20, 22, and 24 are graphs showing characteristics where a simple cell in a conventional flash memory is written back by DAHE/DAHH. FIG. 19 is a case of Vd=5 V, FIGS. 20 and 24 are cases of Vd=8 V, and FIG. 22 is case of Vd=6 V. On the other hand, FIGS. 21, 23, and 25 are graphs of the characteristics where a simple cell in the above flash memory of the present invention is applied by CHE relating to subthreshold leak current.

It is apparent from FIGS. 19 and 20 that there is need of a voltage difference of 6 V or more to save over-erased bits at about 10 msec, and that a state more than the convergence Vth shifts due to use of the convergent point of DAHE/DAHH. On the other hand, in CHE applications as in the present invention, as shown in FIG. 21, it is apparent that the over-erased bits may be saved at a low voltage (Vd>4 V) and at a high speed (about 10 msec) as compared with the DAHE/DAHH method, and that a state more than the convergence Vth does not shift due to injection of electrons only.

Next, as compared FIG. 22 with FIG. 23, it is apparent that when these cases are left in a write back state, the former deteriorates channel conductance, while the latter does not deteriorate it.

Figure 25:
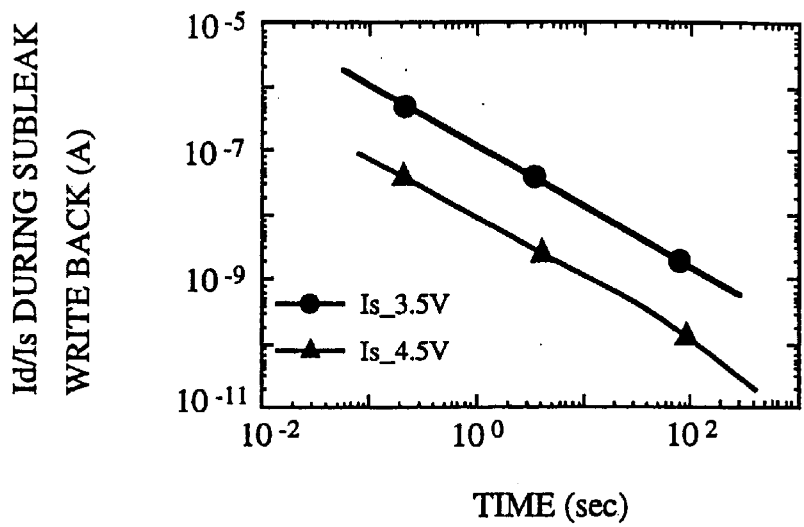
FIG. 25 is a graph showing Id/Is characteristics in a non-volatile semiconductor memory according to the embodiments 1 to 3 of the present invention.

Further, as compared FIG. 24 with FIG. 25, it is apparent that in the convergent state, a channel current flows at about 100 $\mu$A level in the former case, while the channel current is cut off in the latter case.

What is claimed is:

1. A method of driving a non-volatile semiconductor memory arraying a transistor including: first and second diffused layers of a second conductance type in a semiconductor substrate, opposite to each other through a channel region of a first conductance type; and a two-storied gate electrode having a floating gate and a control gate, formed through a gate insulating film on said channel region of the first conductance type, said method comprising the steps of:

setting said channel region of the first conductance type and one of said first and second diffused layers at a first voltage level;

setting the other of said first and second diffused layers at a second voltage level;

setting said control gate at said first or a third voltage level; and injecting into said floating gate a part of charges flowing in said channel region with respect to said transistor flowing a channel current, based on a setting that a voltage difference between said first voltage level and said second voltage level is larger in absolute value than that between said first voltage level and said third voltage level.

2. A method of driving a non-volatile semiconductor memory arraying a transistor including: first and second diffused layers of a second conductance type in a semiconductor substrate, opposite to each other through a channel region of a first conductance type; and a two-storied gate electrode having a floating gate and a control gate, formed through a gate insulating film on said channel region of the first conductance type, said method comprising the steps of:

setting said channel region of the first conductance type at a first voltage level;

setting one of said first and second diffused layers at a second voltage level;

setting the other of said first and second diffused layers at a third voltage level;

setting said control gate at said first, second, or a fourth voltage level;

injecting into said floating gate a part of charges flowing in said channel region with respect to said transistor flowing a channel current, based on a setting that a voltage difference between said first voltage level and said second voltage level is larger in absolute value than both that between said first voltage level and said third voltage level, and that between said first voltage level and said fourth voltage level.

3. A method of driving a non-volatile semiconductor memory according to claim 1, wherein the transistor is applied to a NOR or DINOR flash memory.

4. A method of operating a non-volatile semiconductor memory having a transistor including: first and second diffused layers of a second conductance type in a surface of a semiconductor substrate, opposite to each other through a channel region of a first conductance type; a two-storied gate electrode having a floating gate and a control gate, formed through a gate insulating film on said channel region of the first conductance type; and an electric field buffer layer of the second conductance type, formed between at least one of said first and second diffused layers and said channel region, wherein said diffused layer adjacent to said electric field buffer layer does not overlap with said two-storied gate electrode, said method comprising the steps of:

verifying erase or write performance of said transistor at a predetermined threshold value or less;

setting at a first voltage level said channel region of the first conductance type and one of said first and second diffused layers;

setting at a second voltage level the other of said first and second diffused layers;

setting at a first or third voltage level said control gate; and injecting into said floating gate a part of charges flowing in said channel region with respect to said transistor flowing a channel current, based on a setting that a voltage difference between said first voltage level and said second voltage level is larger in absolute value than that between said first voltage level and said third voltage level.

5. A method of operating a non-volatile semiconductor memory having a transistor including: first and second diffused layers of a second conductance type in a surface of a semiconductor substrate, opposite to each other through a channel region of a first conductance type; a two-storied gate electrode having a floating gate and a control gate, formed through a gate insulating film on said channel region of the first conductance type; and an electric field buffer layer of the second conductance type, formed between at least one of said first and second diffused layers and said channel region, wherein said diffused layer adjacent to said electric field buffer layer does not overlap with said two-storied gate electrode, said method comprising the steps of:

verifying erase or write performance of said transistor at a predetermined threshold value or less;

setting said channel region of the first conductance type at a first voltage level;

setting one of said first and second diffused layers at a second voltage level;

setting the other of said first and second diffused layers at a third voltage level;

setting said control gate at said first, second or a fourth voltage level; and injecting into said floating gate a part of charges flowing in said channel region with respect to said transistor flowing a channel current, based on a setting that a voltage difference between said first voltage level and said second voltage level is larger in absolute value than both that between said first voltage level and said third voltage level and that between said first voltage level and said fourth voltage level.

6. A method of operating a non-volatile semiconductor memory according to claim 4, further comprising a step of performing a write to the transistor to control an occurrence of an over-erased transistor prior to the verifying step.

* * * * *